(12) United States Patent
Maekawa

(10) Patent No.: US 7,696,100 B2
(45) Date of Patent: Apr. 13, 2010

(54) METHOD FOR MANUFACTURING SEMICONDUCTOR DEVICE

(75) Inventor: Shinji Maekawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 20 days.

(21) Appl. No.: 11/132,288

(22) Filed: May 19, 2005

(65) Prior Publication Data

US 2005/0266693 A1 Dec. 1, 2005

(30) Foreign Application Priority Data

Jun. 1, 2004 (JP) ............................. 2004-163172

(51) Int. Cl.
*H01L 21/265* (2006.01)
(52) U.S. Cl. .................. 438/720; 438/128; 438/689; 438/694; 438/759
(58) Field of Classification Search .......... 438/720, 438/128, 759, 689, 694
See application file for complete search history.

(56) References Cited

U.S. PATENT DOCUMENTS

| | | | |
|---|---|---|---|
| 5,824,235 A | 10/1998 | Yamazaki et al. | |
| 5,923,961 A | 7/1999 | Shibuya et al. | |
| 5,930,607 A | 7/1999 | Satou | |
| 5,938,942 A | 8/1999 | Yamazaki et al. | |
| 5,946,560 A | 8/1999 | Uochi et al. | |
| 6,025,607 A | 2/2000 | Ohori et al. | |
| 6,172,671 B1 | 1/2001 | Shibuya et al. | |
| 6,277,679 B1 | 8/2001 | Ohtani | |
| 6,346,486 B2 | 2/2002 | Uochi et al. | |
| 6,365,917 B1 | 4/2002 | Yamazaki | |
| 6,515,336 B1 | 2/2003 | Suzawa et al. | |
| 6,599,785 B2 | 7/2003 | Hamada et al. | |
| RE38,292 E | 10/2003 | Satou | |
| 6,833,313 B2 | 12/2004 | Hayakawa | |

(Continued)

FOREIGN PATENT DOCUMENTS

CN 1165568 11/1997

(Continued)

OTHER PUBLICATIONS

K. Pfeiffer et al., "A Comparison Of Thermally And Photochemically Cross-Linked Polymers For Nanoimprinting," Micro Electronic Engineering, vol. 67-68, 2003, pp. 266-273.

(Continued)

*Primary Examiner*—Nadine G Norton
*Assistant Examiner*—Mahmoud Dahimene
(74) *Attorney, Agent, or Firm*—Eric J. Robinson; Robinson Intellectual Property Law Office, P.C.

(57) ABSTRACT

A manufacturing method of a semiconductor device of which cost can be suppressed by using a nanoimprinting method is provided. In the invention, a gate insulating film, a conductive film, and a resist are formed in sequence over a semiconductor film and a resist is hardened while pressing a mold formed with a pattern to the resist. Therefore, the pattern is transferred to the resist, the surface of the resist to which the pattern is transferred is ashed until a part of the conductive film is exposed, the resist having the ashed surface is used a mask, and the conductive film is etched.

17 Claims, 12 Drawing Sheets

U.S. PATENT DOCUMENTS

| | | |
|---|---|---|
| 6,833,327 B2 | 12/2004 | Ishikawa |
| 6,853,004 B2 | 2/2005 | Ohtani |
| 6,869,557 B1* | 3/2005 | Wago et al. .................. 264/293 |
| 6,909,114 B1 | 6/2005 | Yamazaki |
| 2003/0155571 A1 | 8/2003 | Hayashi et al. |
| 2003/0207506 A1 | 11/2003 | Satou |
| 2004/0038552 A1* | 2/2004 | Watts et al. .................. 438/759 |
| 2004/0232495 A1* | 11/2004 | Saito et al. .................. 257/382 |
| 2004/0239840 A1* | 12/2004 | Ikeda et al. .................. 349/106 |
| 2005/0062043 A1* | 3/2005 | Yang et al. .................... 257/66 |
| 2005/0062125 A1* | 3/2005 | Kitaguchi .................... 257/492 |
| 2005/0064344 A1* | 3/2005 | Bailey et al. ................. 430/320 |
| 2005/0082541 A1 | 4/2005 | Satou |
| 2005/0084999 A1 | 4/2005 | Satou |
| 2005/0104071 A1 | 5/2005 | Satou |
| 2005/0233509 A1 | 10/2005 | Satou |
| 2006/0083993 A1* | 4/2006 | Kirch et al. ...................... 430/5 |

FOREIGN PATENT DOCUMENTS

| | | |
|---|---|---|
| CN | 1222759 | 7/1999 |
| JP | 2003-272998 | 9/2003 |

OTHER PUBLICATIONS

Office Action (Application No. 200510075912.6) Dated Feb. 15, 2008.

Carcenac.F et al., "Fabrication of multiple nano-electrodes for molecular addressing using high-resolution electron beam lithography and their replication using soft imprint lithography," Microelectronic Engineering, 2002, pp. 657-663.

Office Action (Application No.200510075912.6) Dated Sep. 25, 2009.

* cited by examiner

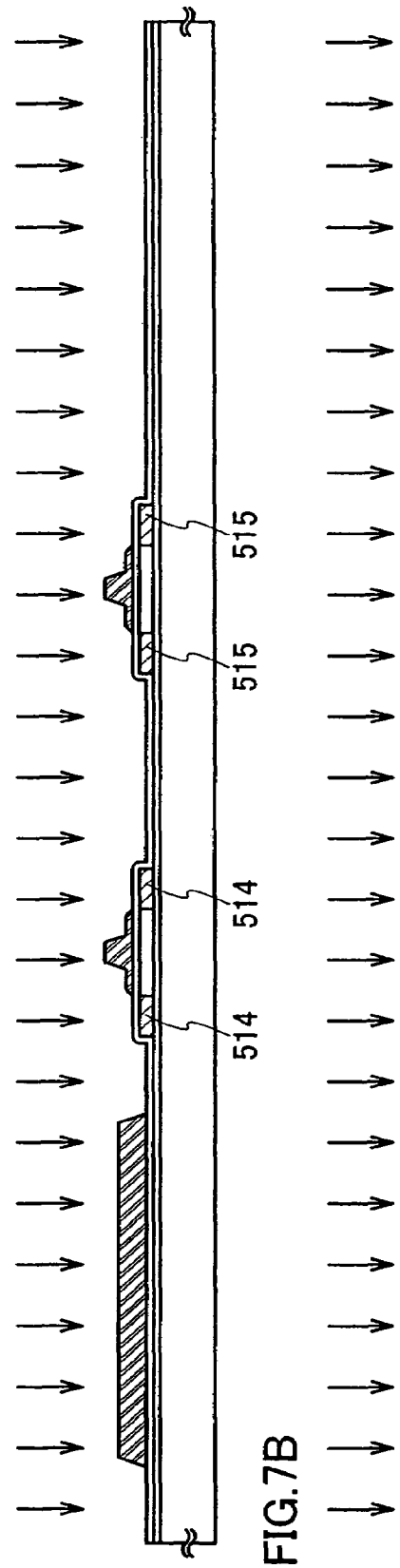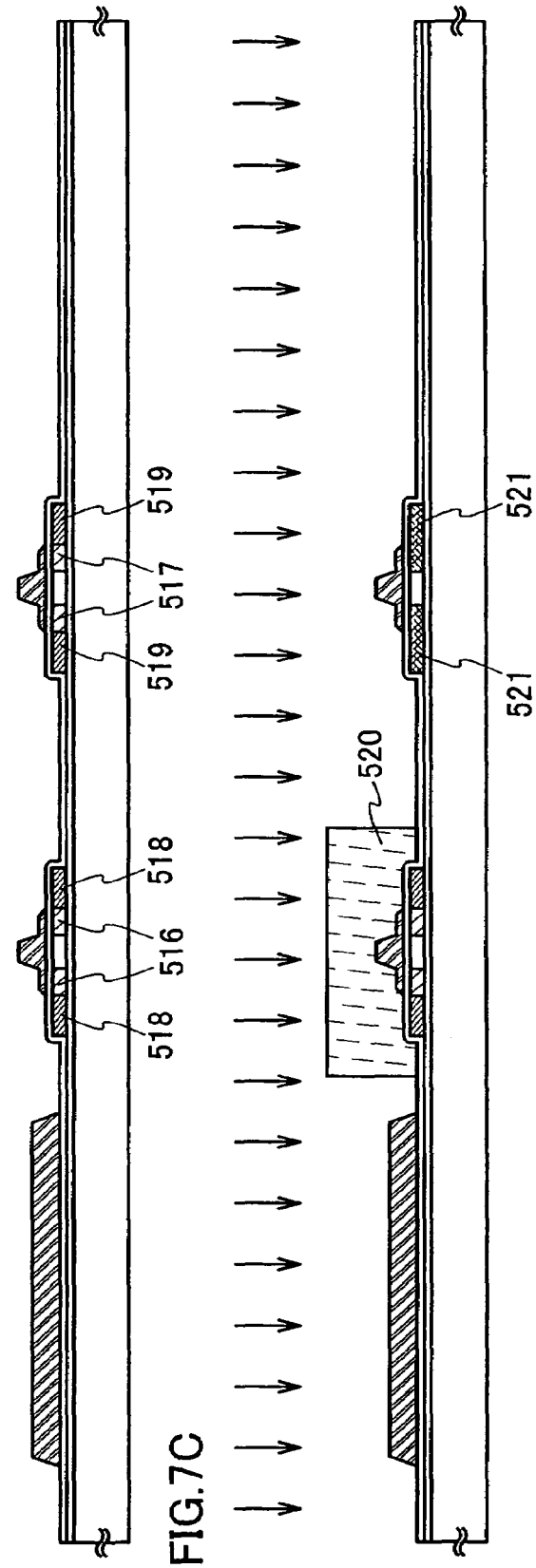

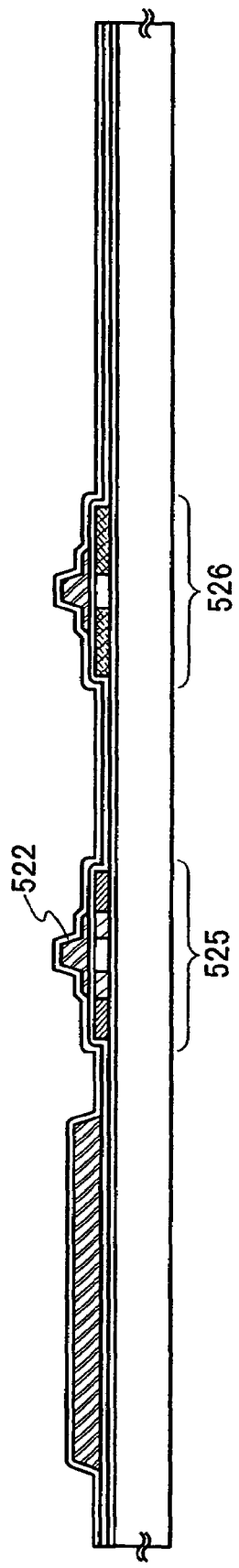
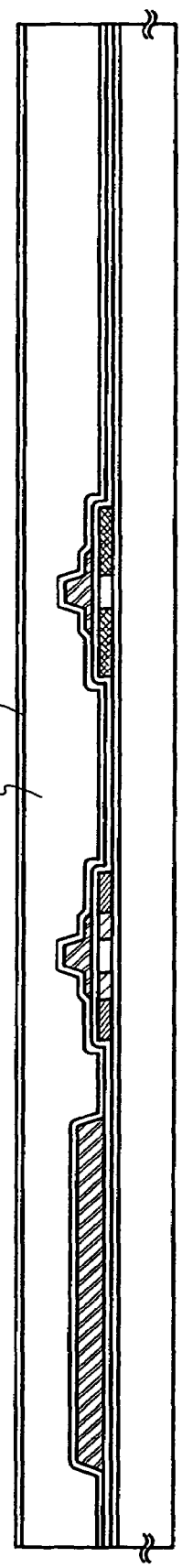
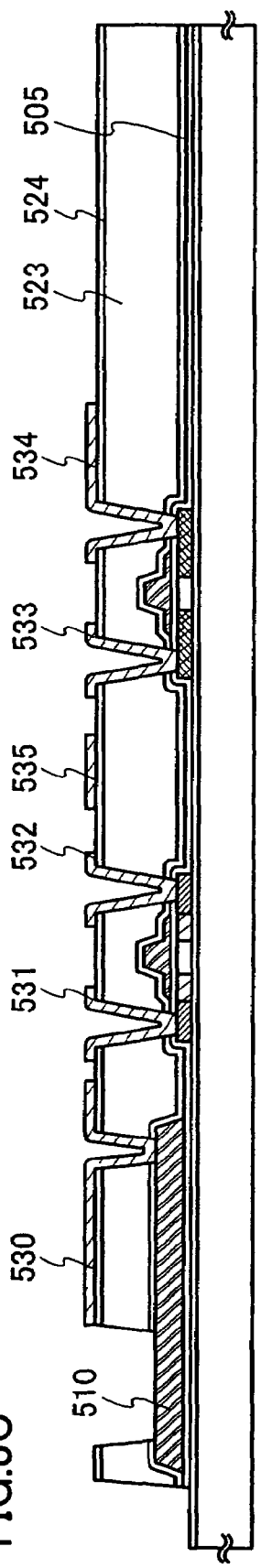
FIG.8A
FIG.8B
FIG.8C

METHOD FOR MANUFACTURING SEMICONDUCTOR DEVICE

BACKGROUND OF THE INVENTION

1. Field of Invention

The present invention relates to a method for manufacturing a semiconductor device applying a nanoimprinting method.

2. Description of the Related Art

In manufacturing a semiconductor device, patterning is generally carried out by lithography. However, a mask (a photomask) for exposure which is used in the lithography is extremely expensive, and that is a part of a reason that the cost of the semiconductor device can not be reduced. Recently, the nanoimprinting method by which a pattern is transferred onto a particular layer over a substrate, by pressing a mold having a concavo-convex pattern, has drawn attention.

By using the nanoimprinting method, a pattern can be transferred onto a resist without using a photomask for exposure and a resistmask for lithography can be formed. The reference 1 (Japanese Patent Laid-Open No.2003-272998) discloses a technique to form a pattern in a photoresist by pressing a mold to the photoresist.

A semiconductor element using a thin semiconductor film such as a thin film transistor (TI) used for a semiconductor device is formed through various manufacturing steps. Specifically, after an island shaped semiconductor film is formed, a gate insulating film is formed and a gate electrode is formed over the gate insulating film. By using a gate electrode or a patterned resist as a mask, impurities imparting n-type or p-type conductivity are doped to the island shaped semiconductor film so as to form a source region, a drain region, LDD regions, and the like.

SUMMARY OF THE INVENTION

The reference 1 does not disclose how to apply the nonoimprinting method in the manufacturing method of the semiconductor device using the thin semiconductor film. Therefore, it is an object of the present invention to provide a manufacturing method of a semiconductor device which can reduce the cost by using the nanoimprinting method.

In the present invention, a resist mask formed by the nanoinprinting method is used as a mask for forming an island shaped semiconductor film, a gate electrode, a wiring, a contact hole, and the like by patterning. In this invention, after a concave portion is directly formed in an insulating film formed of a resin or the like by the nanoimprinting method, the concave portion is etched so as to form a contact hole in the insulating film.

Specifically, a gate insulating film, a conductive film, and a resist are sequentially formed over an island shaped semiconductor film, and the resist is hardened with the patterned mold pressed to the resist. Therefore, the pattern is transferred to the resist, and the surface of the resist to which the pattern is transferred is ashed until a part of the conductive film is exposed. Then the conductive film is etched by using the ashed resist as a mask.

A semiconductor device formed using a thin semiconductor film has a small degree of integration compared to a semiconductor device formed over a monocrystal silicon wafer. Thus, it is an important object to downsize the semiconductor element for practical application. For downsizing of the TFT, a problem that reliability is reduced is accompanied due to a hot carrier effect. As a means for suppressing the hot carrier effect, an LDD (Lightly Doped Drain) structure is known. The LDD structure includes an LDD region having an impurity concentration lower than a source region, between the source region and a channel formation region, and an LDD region having an impurity concentration lower than a drain region, between the drain region and the channel formation region. When the LDD regions have a Gate Overlapped Lightly Doped Drain structure (GOLD structure) where the LDD regions overlap with a gate electrode with a gate insulating film interposed therebetween, it is known that high electric field in the vicinity of the drain is relieved to efficiently prevent the hot carrier effect and the reliability is improved. In this specification, a region where the LDD regions overlap with a gate electrode with a gate insulating film interposed therebetween is referred to as an Lov region and a region where the LDD regions do not overlap with the gate electrode is referred to as an Loff region.

Several manufacturing methods of a TFT having LDD regions are proposed. As one of the methods, LDD regions are formed by providing steps for a gate electrode using a plurality of conductive films and utilizing the steps when ion implantation is carried out. However, in the case of using the above method, the conductive film is required to be etched more than once while changing an etching gas or various conditions so as to provide steps in the gate electrode. In addition, there is a method to form the LDD regions by performing doping more than once by changing the resist mask variously. However, in the above mentioned method, the number of the resist masks and steps can not be reduced.

In this invention, by using the nanoimprinting method, steps are provided for the resistmask and utilized to form a gate electrode having steps. By using the gate electrode having the steps as a mask, LDD regions can be formed while suppressing the number of resist masks and the number of etching.

In this specification, the semiconductor device includes an integrated circuit and a semiconductor display device. Also the integrated circuit includes all kinds of circuits using a semiconductor element such as a microprocessor, and an image processing circuit. Further, the semiconductor display device includes a liquid crystal display device; a light emitting device having pixels each of which is provided with a light emitting element typified by an organic light emitting element (OLED); a DMD (Digital Micromirror Device); a PDP (Plasma Display Panel); an FED (Field Emission Display), and other display devices having a circuit element using a semiconductor film.

According to the above mentioned structure, a semiconductor device using a thin semiconductor film can be formed while the number of photomasks is suppressed in this invention. Further, by providing steps in the resistmask using the nanoimprinting method, a TFT having LDD regions can be formed while the number of the resistmasks and the number of etching are reduced.

BRIEF DESCRIPTION OF DRAWINGS

FIGS. 2A to 2D are diagrams showing a method for manufacturing a semiconductor device of the invention.

FIGS. 7A to 7C are diagrams showing a method for manufacturing a semiconductor device of the invention.

FIGS. 8A to 8C are diagrams showing a method for manufacturing a semiconductor device of the invention.

DETAILED DESCRIPTION OF THE INVENTION

Best Mode For Carrying Out The Invention

Embodiment modes of the present invention are hereinafter described with reference to drawings. However, it can be easily understood by skilled people that the invention can be conducted in many different modes, and the modes and the detail can be changed variously without departing from the purpose and the scope of the invention. Thus the invention is not interpreted as being limited to the description of the embodiment modes.

Embodiment Mode 1

In this embodiment mode, a manufacturing method of a resist mask used in a manufacturing method of a semiconductor device in this invention is described.

Figure 1A:
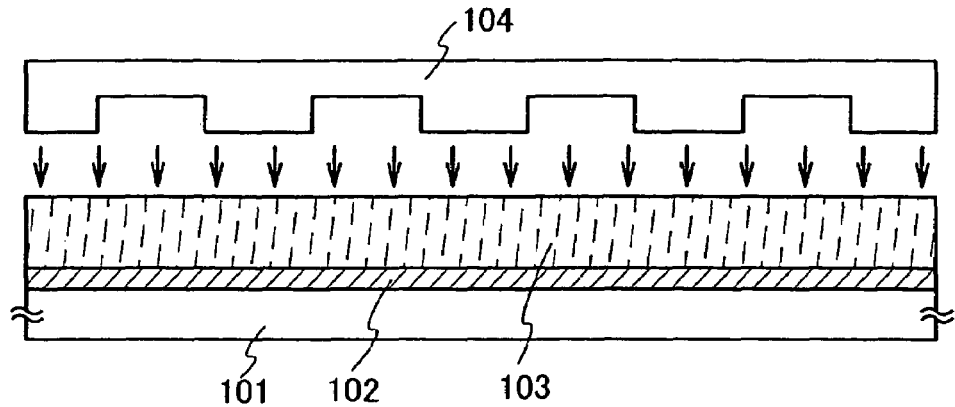
FIGS. 1A to 1E are diagrams showing a method for manufacturing a semiconductor device of the invention.

First, as shown in FIG. 1A, a layer which is to be patterned (hereinafter referred to as patterning layer) 102 is formed on a substrate 101. A semiconductor film, a conductive film, or an insulating film can be used for the patterning layer 102. A resist 103 is formed on the patterning layer 102. The material of the resist 103 is desirably changed depending on the kinds of nanoimprinting method such as a thermal cycle nanoimprinting method, a room temperature nanoimprinting method, and a photo nanoimprinting method. In this embodiment mode, an example of patterning the resist 103 by a photo cycle nanoimprinting method with the use of a photo-curing resin for the resist 103 is described. As the photo-curing resin, a negative photoresist, for example, such as a resist containing polymethyl isopropenyl ketone (PMIPK) and bisazide; a resist containing polyisoprene cyclization and bisazide; a resist containing polyvinyl phenol and bisazide; a resist containing chloromethylation polystyrene, or the like can be used. The resist 103 is formed by spin coating, slit-coating, or the like. Alternatively, the resist 103 can be selectively applied to the necessary portions by ink jetting or screen printing.

Figure 1B:
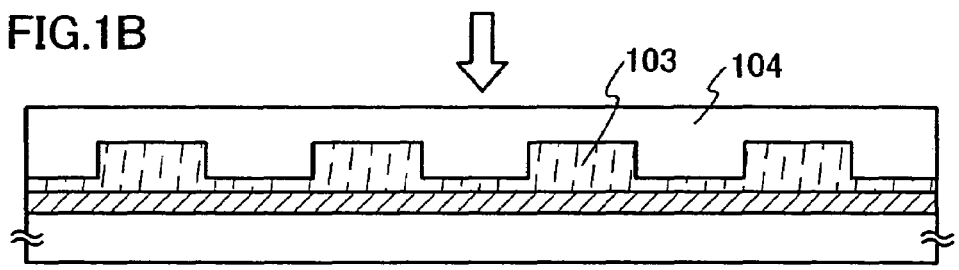

Then a mold 104 which is formed with a pattern in advance is pressed to the resist 103 as shown in FIG. 1B. The material of the mold 104 is desirably changed depending on the kinds of nanoimprinting method such as a thermal cycle nanoimprinting method, a room temperature nanoimprinting method, and a photo nanoimprinting method. For example, in the case of applying the photo nanoimprinting method, the mold 104 is formed of a material which can transmit light to harden the resist 103. In this embodiment mode, the mold 104 formed of quartz is used. The pattern of the mold 104 can be formed using EB (electron beam lithography).

The resist 103 is hardened while the mold 104 is pressed to the resist 103. According to the above-mentioned structure, the pattern formed in the mold 104 is transferred to the resist 103. In the case of using the photo nanoimprinting method, the resist 103 can be hardened by irradiating the resist 103 with light such as ultraviolet light. In the case of the photo nanoimprinting method, the resist 103 is desirably hardened while the mold 104 is pressed to the resist 103 under a low pressure atmosphere of approximately 133 Pa ($10^{-2}$ Torr) in order to prevent bubbles from entering between the mold 104 and the resist 103.

In the case of the thermal cycle nanoimprinting method, a thermoplastic resin is used for the resist 103, and the resist 103 is softened by being heated to higher temperature than a transition temperature before pressing the mold 104 to the resist 103. Then the resist 103 is cooled to have lower temperature than the transition temperature while pressing the mold thereto to harden the resist 103.

In the case of the room temperature nanoimprinting method, a sol-gel material such as SOG (Spin on Glass) is used for the resist 103, and the mold 104 is pressed to the resist 103 in the room temperature. The pattern can be transferred to the resist 103 by removing the mold 104 from the resist 103.

Figure 1C:
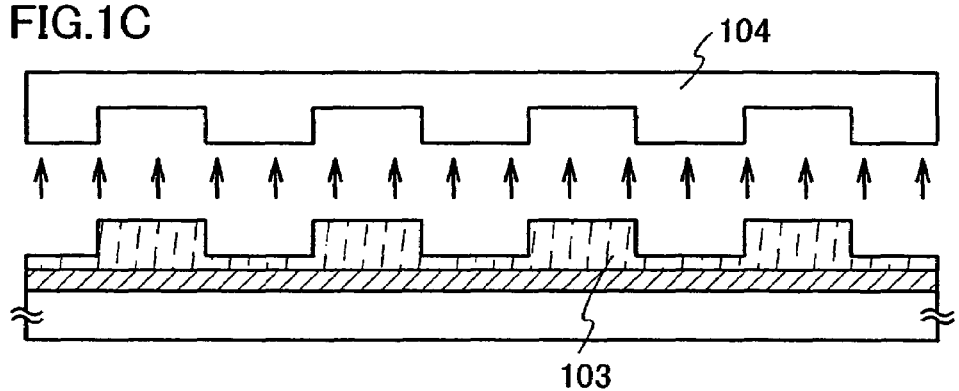

As shown in FIG. 1C, the mold 104 is removed from the resist 103. At this time, by adding vibration to the resist 103 using an ultrasonic wave, the mold 104 can be removed from the resist 103 while preventing deformation of the resist 103. By removing the mold 104, the resist 103 formed with the pattern can be obtained.

Figure 1D:
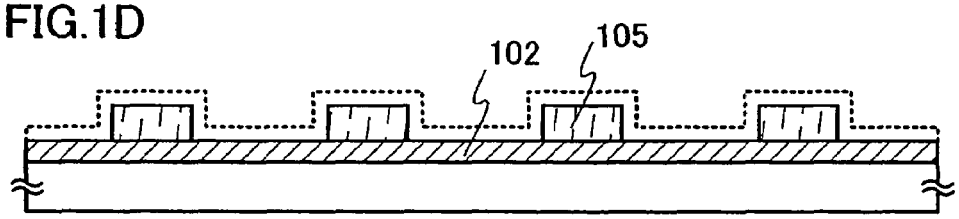

As shown in FIG. 1D, the surface of the resist 103 over which the pattern is formed is treated by ashing or the like to remove a part of the resist 103 in order to expose a part of the patterning layer 102. By removing the surface of the resist 103 by ashing or the like, the resist 103 can be formed into the resist mask 105.

Figure 1E:
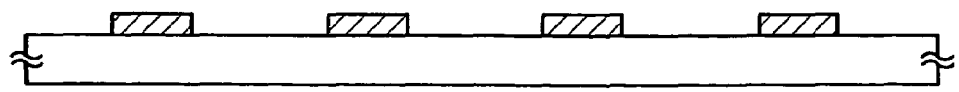

As shown in FIG. 1E, the patterning layer 102 can be patterned by etching using the resist mask 105.

In this embodiment mode, the resist 103, which is subjected to ashing to the extent enough to expose a part of the patterning layer 102, is used as the resist mask 105; however, the invention is not limited to this structure. The resist 103 formed with the pattern which is not subjected to ashing may be used as the resist mask.

According to the above-mentioned structure, an island shaped semiconductor film, a gate electrode, a wiring, a contact hole, and the like can be formed by pattering without using a photomask.

Embodiment Mode 2

In this embodiment mode, a mode to directly form a contact hole into an insulating film formed of a resin or the like by a nanoimprinting method is described. An example in the case of applying a thermal cycle nanoimprinting method, is described here, however, a photo cycle nanoimprinting method or a room temperature nanoimprinting method may be used.

Figure 2B:
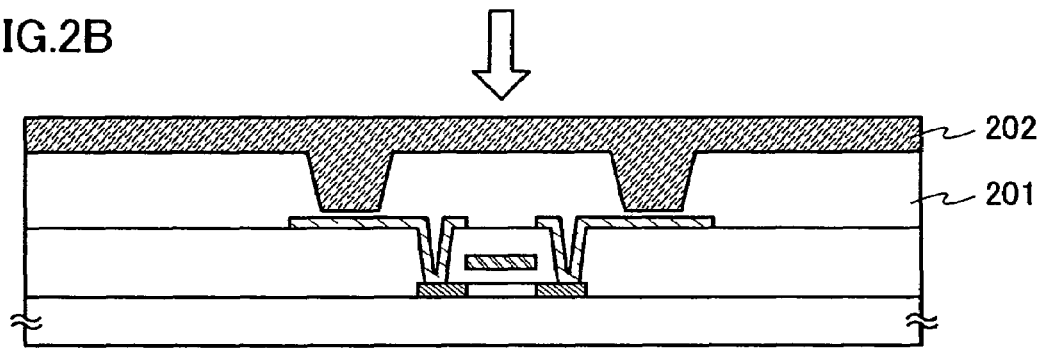

First, as shown in FIG. 2A, an insulating film 201 is formed so as to cover a wiring 204. Then, as shown in FIG. 2B, a mold 202 formed with a pattern is pressed to the insulating film 201. In this embodiment mode, the thermal cycle nanoimprinting method is used, and therefore a thermoplastic resin for example, such as poly(methyl methacrylate) (PMMA), polyethylene, polystyrene, polyvinyl chloride, polyamide, or the like can be used. In FIG. 2A, an example of using PMMA for the insulating film 201 is described. The insulating film 201 is heated to higher temperature than the transition temperature of the insulating film 201, for example, 90° C. to 200° C. before pressing the mold 202 thereto.

Figure 2C:
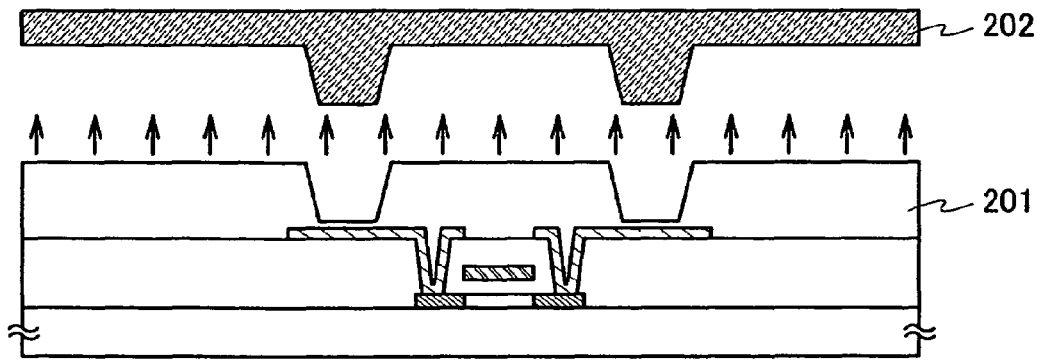

As shown in FIG. 2B, while the mold 202 is kept to be pressed to the insulating film 201, the insulating film 201 is cooled to the temperature that is lower than the transition temperature of the insulating film 201, for example 70° C., thereby being hardened. When the insulating film 201 is hardened, the mold 202 is removed from the insulating film 201 as shown in FIG. 2C. The pattern of the mold 202 is transferred to the insulating film 201 from which the mold 202 is removed.

Figure 2D:
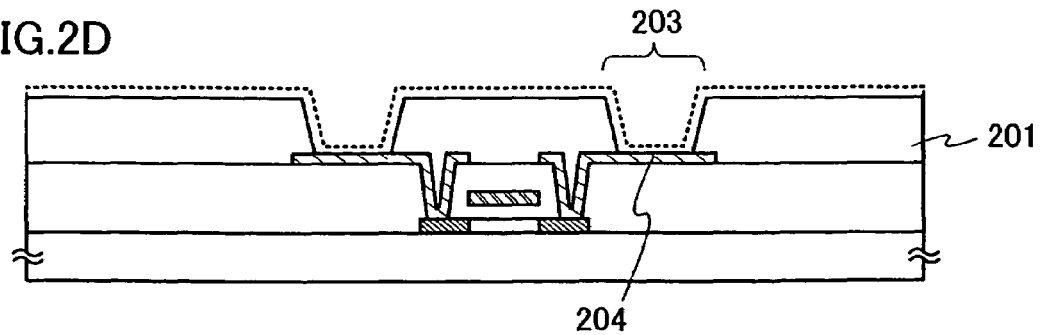

As shown in FIG. 2D, the surface of the insulating film 201 is treated by ashing or the like to remove a part of the insulating film 201 so as to expose a part of the layer (the wiring 204 in this embodiment) formed below the insulating film 201, thereby forming a contact hole 203.

According to the above mentioned structure, the contact hole 203 can be formed without forming a resist mask. Since lithography is not required to be used, a series of steps such as formation of the resist, light-exposure, development, etching, and separation can be omitted to simplify the manufacturing steps, and the cost of the semiconductor device can be reduced.

This embodiment mode can be combined with the above embodiment modes.

Embodiment Mode 3

In this embodiment mode, a mode to form a gate electrode having steps by using a nanoimprinting method is described. Here, the case of applying a thermal cycle nanoimprinting method is described as an example; however, a photo cycle nanoimprinting method or a room temperature nanoimprinting method may be used.

Figure 3A:
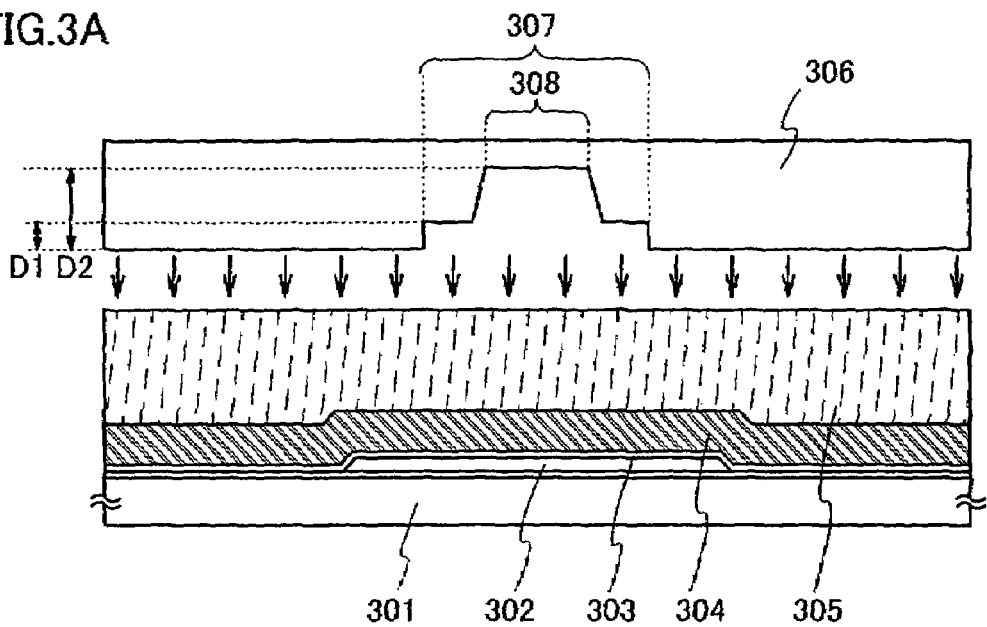
FIGS. 3A to 3D are diagrams showing a method for manufacturing a semiconductor device of the invention.

First, as shown in FIG. 3A, an island shaped semiconductor film 302 used as an active layer is formed over a substrate 301. Then, a gate insulating film 303 is formed so as to be in contact with the island shaped semiconductor film 302, thereby forming a conductive film 304 over the gate insulating film 303. The example of using a single layer for the conductive film 304 is shown; however, the conductive film 304 may be composed of a plurality of layers.

Figure 3B:
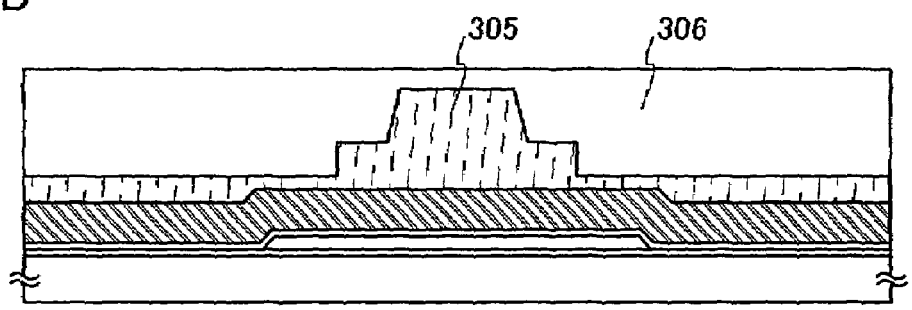

Then, a resist 305 is formed over the conductive film 304. In this embodiment mode, an example of using PMMA for the resist 305 is shown. The resist 305 is formed by spin coating, slit coating, or the like. Alternatively, the resist 305 can be selectively applied to the necessary portions by ink jetting or screen printing. As shown in FIG. 3B, the resist 305 is heated up to 90° C. to 200° C. to being softened, and a mold 306 formed with a pattern is pressed to the resist 305. In this embodiment mode, in a first concavity portion 307 having a depth D1, a second concavity portion 308 having a further depth D2 is formed in the mold 306. Note that D1 is smaller than D1 (D1<D2).

The resist 305 is cooled down to 70° C. to be hardened while the mold 306 is pressed to the resist 305. According to the above structure, a pattern formed in the mold 306 is transferred to the resist 305.

Figure 3C:
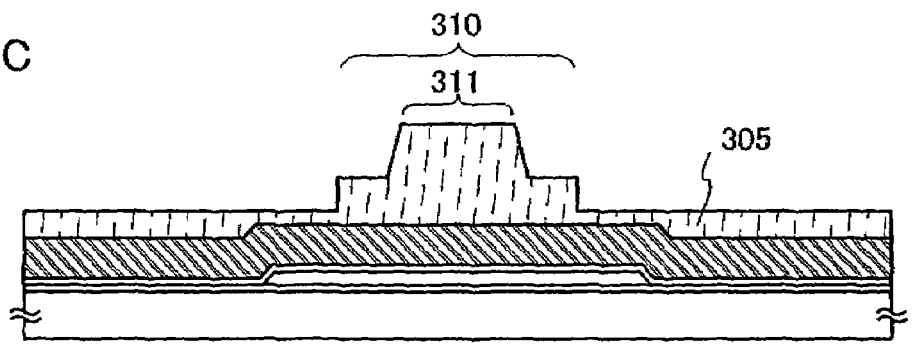

As shown in FIG. 3C, the mold 306 is removed from the resist 305. By removing the mold 306, the resist 305 formed with a pattern can be formed. Specifically, a first convex portion 310 according to the shapes of the first concavity portion 307 and the second convex portion 311 according to the second concavity portion 308 are formed.

Figure 3D:
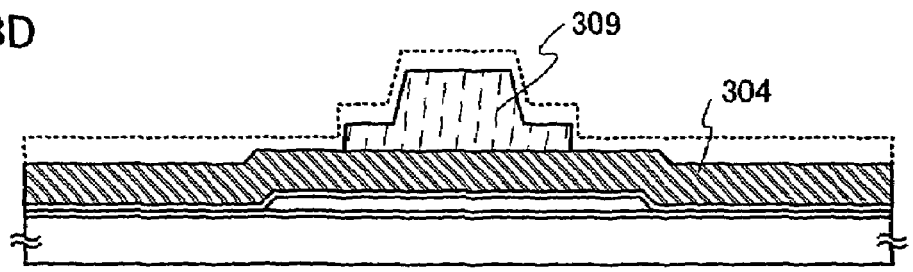

As shown in FIG. 3D, the surface of a resist 305 is treated by ashing or the like to remove a part of the resist 305 to expose a part of the conductive film 304. By removing the surface of the resist 305 by ashing or the like, the resist 305 is formed into a resist mask 309. The resist mask 309 includes steps formed of the first convex portion 310 and the second convex portion 311, and the size of the steps is determined by the difference of the depth between the first concavity portion 307 and the second concavity portion 308 in the mold 306.

Figure 4A:
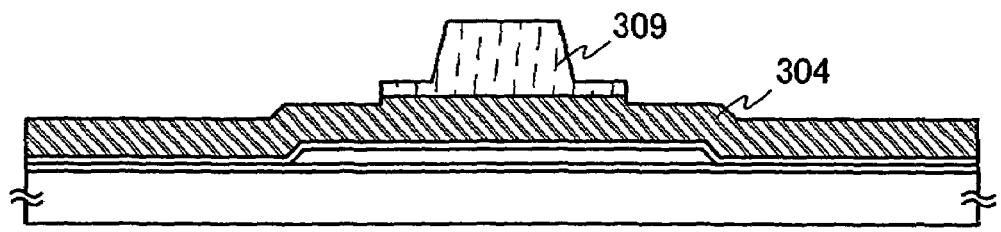
FIGS. 4A to 4D are diagrams showing a method for manufacturing a semiconductor device of the invention.
Figure 4B:
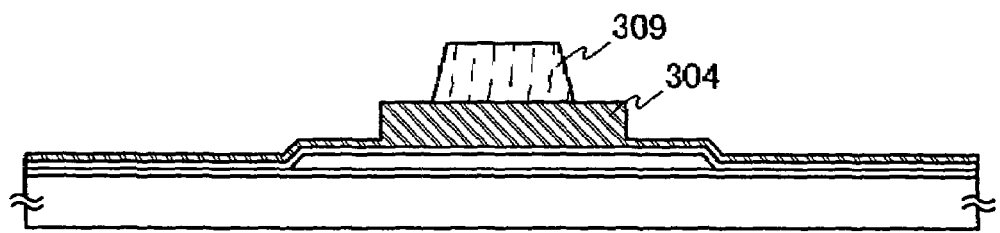
Figure 4C:
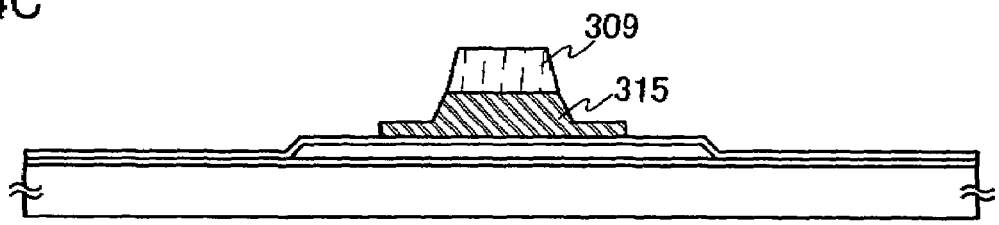

As shown in FIG. 4A, a conductive film 304 is etched using the resist mask 309. Dry etching capable of isotropic etching is conducted. Etching is carried out starting from the exposed area of the conductive film 304 with precedence, and then the resist mask 309 is etched. As shown in FIG. 4B, when a portion with smaller thickness (the first convex portion 310) in the resist mask 309 disappears by etching, etching proceeds to the area of the conductive film 304 which is newly exposed. Finally, the conductive film 304 is formed into a gate electrode 315 having steps.

The shape of the gate electrode 315 depends on the shape of the resist mask 309 before performing etching and the pattern shape included in the mold 306 in addition to the etching condition and the material of the resist 305. Therefore, when the etching condition and the material of the resist 305 are determined in advance, the shapes of the first concavity portion 307 and the second concavity portion 308 in the mold 306 are properly changed.

Figure 4D:
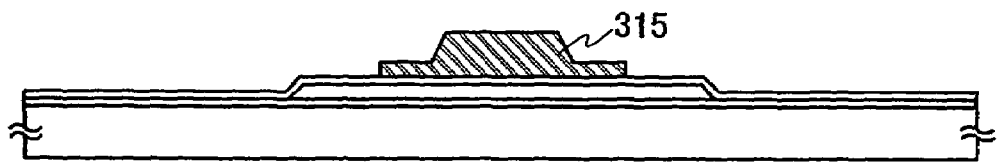

Lastly, the resist mask 309 is removed as shown in FIG. 4D.

In this embodiment mode, the resist 305, which is subjected to ashing to the extent enough to expose to a part of the conductive film 304, is used for the resist mask 309. However, the invention is not limited to this structure. Further, the resist 305 formed with the pattern, which is not subjected to ashing may be used as a resist mask.

This embodiment mode can be conducted in combination with the above mentioned embodiment modes.

Embodiment Mode 4

In this embodiment mode, an example of forming a light emitting device which is one of semiconductor display devices with the use of a manufacturing method of the present invention is described.

Figure 5A:
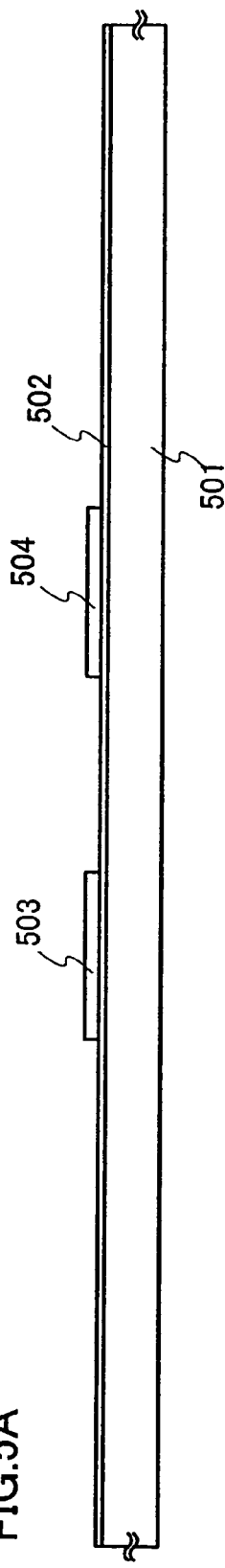
FIGS. 5A to 5C are diagrams showing a method for manufacturing a semiconductor device of the invention.

First, as shown in FIG. 5A, a base film 502 is formed using an insulating film on an insulating surface of the substrate 501.

A glass substrate such as barium borosilicate glass and alumino borosilicate glass, a quartz substrate, a stainless substrate, or the like can be used for the substrate 501. The substrate formed of plastic typified by PET, PES, and PEN, and a synthetic resin having flexibility such as acryl generally tends to have lower heat-resistance temperature compared to the above mentioned substrates, however, it can be used as far as it can stand the processing temperature in the manufacturing steps.

A base film 502 is provided so as to prevent alkali metal such as Na and alkaline earth metal in the substrate 501 from diffusing into the semiconductor film and having an adverse effect on the characteristic of the semiconductor element. The base film 502 is formed using an insulating film such as silicon oxide, silicon nitride, or silicon nitride oxide, each of which can prevent alkali metal and alkaline earth metal from diffusing into the semiconductor film. In this embodiment mode, the base film 502 is formed using a silicon nitride oxide film with a thickness of 10 nm to 400 nm (preferably 50 nm to 300 nm) by plasma CVD.

The base film 502 may be a single layer or laminated layers of a plurality of insulating films. It is effective to provide the base film in terms of preventing impurities from diffusing in the case of using a substrate which includes even a slight amount of the alkali metal or the alkaline earth metal such as a stainless substrate or a plastic substrate. However, the base film is not necessarily provided when diffusion of impurities is not a problem such as the case of using a quartz substrate.

Next, island shaped semiconductor films 503 and 504 are formed over the base film 502. The semiconductor films used for the island shaped semiconductor films 503 and 504 are desirably formed by not being exposed to the atmosphere after forming the base film 502. The thickness of the island shaped semiconductor films 503 and 504 is 20 nm to 200 nm (preferably, 40 nm to 170 nm, and more preferably 50 nm to 150 nm). Each of the island shaped semiconductor films 503 and 504 may be an amorphous semiconductor, semi-amorphous semiconductor or a polycrystalline semiconductor. Further, not only silicon but also silicon germanium may be used for the semiconductor. In the case of using the silicon germanium, the concentration of the germanium is preferably about 0.01 atomic % to 4.5 atomic %.

The semiconductor films used for the island shaped semiconductor films 503 and 504 may be crystallized by known technique. As the known crystallization, laser crystallization using laser light, crystallization using a catalyst element can be used. In addition, the crystallization using the catalyst element and the laser crystallization may be combined. In the case of using a substrate which has great heat resistance such as quartz for a substrate 501, thermal crystallization using an electrically heated reactor, lamp anneal crystallization using infrared light, or a combination of the crystallization using the catalyst element and an anneal crystallization of high temperature at approximately 950° C. may be used.

For example, in the case of using the laser crystallization, before performing the laser crystallization, heat treatment at 550° C. is performed for 4 hours so as to increase the resistance of the semiconductor film to laser. Subsequently, by irradiating the semiconductor film with laser light of the second harmonic to the fourth harmonic using a solid state laser which is capable of continuous oscillation, crystals of large grain size can be obtained. Typically, it is preferable to use the second harmonic (532 nm) or the third harmonic (355 nm) of an Nd:YVO$_4$ laser (fundamental wave: 1064 nm). Specifically, laser light emitted from a continuous wave type YVO$_4$ laser is converted to the harmonic with the use of a non-linear optical element to obtain laser light with the output power of 10 W. Preferably, laser light is formed to have a rectangular shape or an elliptical shape at an irradiated surface by using an optical system to irradiate the semiconductor film with the laser light. On this occasion, an energy density of approximately 0.01 to 100 MW/cm$^2$ ((preferably 0.1 MW/cm$^2$ to 10 MW/cm$^2$) is necessary. The scanning speed thereof is set to approximately 10 cm/sec to 2000 cm/sec to emit laser light.

Laser crystallization may be conducted by setting oscillation frequency of pulsed laser light at 10 MHz or more which is extremely higher frequency than that of several tens to several hundreds Hz which is usually used. It is said that it takes several ten nsec to several hundred nsec to completely solidify the semiconductor film after the semiconductor film is irradiated with the pulsed laser light. When the pulsed laser light has the oscillation frequency of 10 MHz or more, the semiconductor film can be irradiated with the next pulsed layer before the semiconductor film is melted to be solidified by the laser light. Therefore, since the interface between the solid phase and the liquid phase can be moved continuously in the semiconductor film, the semiconductor film having crystal grains grown continuously toward the scanning direction is formed. Specifically, it is possible to form aggregation of crystal grains each of which has a width of 10 μm to 30 μm in a scanning direction and a width of approximately 1 μm to 5 μm in a direction perpendicular to the scanning direction. It is also possible to form a semiconductor film having few crystal grain boundaries at least in a channel direction of the TFT by forming single crystal-grains aligned in the scanning direction.

As for the laser crystallization, continuous wave laser light of a fundamental wave and continuous wave laser light of a harmonic may be irradiated in parallel or continuous wave laser light of a fundamental wave and pulsed laser light of a harmonic may be irradiated in parallel.

Laser light may be emitted in an inert gas atmosphere such as a rare gas or nitrogen. Thus, unevenness in a surface of a semiconductor which is produced due to the laser irradiation can be suppressed, and variation of threshold values due to variation of the interface state density can be suppressed.

A semiconductor film having enhanced crystallinity is formed by irradiating the semiconductor film with the laser light as described above. Note that a polycrystalline semiconductor which is formed in advance by sputtering, plasma CVD or thermal CVD may be used as the semiconductor films 503 and 504.

The semiconductor film used for the island shaped semiconductor films 503 and 504 is crystallized in this embodiment mode, however, an amorphous silicon film or a microcrystalline semiconductor film may be used in the next process without performing the crystallization. A TFT using an amorphous semiconductor or a microcrystalline semiconductor needs fewer manufacturing steps than a TFT using a polycrystalline semiconductor, thus, it has advantages of lower cost and enhanced yield.

The amorphous semiconductor film can be obtained by decomposing silicon source gas using glow discharge. As the typical silicon source gas, SiH$_4$ and Si$_2$H$_6$ are given as examples. The silicon source gas may be diluted with hydrogen, or hydrogen and helium.

A semi-amorphous semiconductor has an intermediate structure between an amorphous structure and a crystalline structure (including single crystalline and polycrystalline structure). This semi-amorphous semiconductor is a semiconductor having a third state that is stable with respect to free energy, which is a crystalline material including a short range order and lattice distortion. Crystal grains of 0.5 nm to 20 nm in size can be contained in the amorphous semiconductor As for the semi-amorphous semiconductor, the Raman spectrum is shifted to the lower frequency than 520 cm$^{-1}$, and diffraction peaks of (111) and (220), which supposedly derive from a silicon crystal lattice are observed by the x-ray diffraction. Further, the semi-amorphous semiconductor contains hydrogen or halogen of 1 atom % or more for terminating a dangling bond. Herein, the semi-amorphous semiconductor is referred to as a SAS for convenience. When a rare gas element such as helium, argon, krypton, or neon is mixed into the SAS, the lattice distortion is increased more and the stability is thus enhanced, thereby providing a preferable SAS.

The SAS can be obtained by decomposing the silicon source gas by grow discharge. As the typical silicon source gas, SiH$_4$ is given. Besides, Si$_2$H$_6$, SiH$_2$Cl$_2$, SiHCl$_3$, SiCl$_4$, SiF$_4$, or the like can be used. Furthermore, when the silicon source gas is diluted with hydrogen or with a mixed gas of hydrogen and one or more rare gas elements selected from helium, argon, krypton, and neon, the semi-amorphous semiconductor can be obtained easily. The dilution ratio is preferably from 2 times to 1000 times. Moreover, a carbon source gas such as CH$_4$ or C$_2$H$_6$, a germanium source gas such as GeH$_4$ or GeF$_4$, F$_2$, or the like may be mixed into the silicon source gas with the energy band width controlled to be in the range of 1.5 to 2.4 eV or 0.9 to 1.1 eV.

For example, when a TFr is formed of a semi-amorphous semiconductor manufactured by using a $SiH_4$ gas diluted with $H_2$ or a $SiH_4$ gas diluted with $F_2$, the TFT can have the subthreshold coefficient (S value) of 0.35 V/sec or less, typically in the range of 0.09 to 0.25 V/sec, and the mobility of 10 $cm^2$/V sec. When such a TFT formed of the semi-amorphous semiconductor is used to form 19-stage ring oscillator, it is possible to obtain the oscillation frequency rate from 1 MHz or more, and more preferably 100 MHz or more at the power supply voltage from 3 to 5 V. Moreover, at the power supply voltage from 3 to 5 V, the delay time is suppressed down to 26 ns or less, preferably 0.26nm or less per stage of the inverter.

Figure 5B:
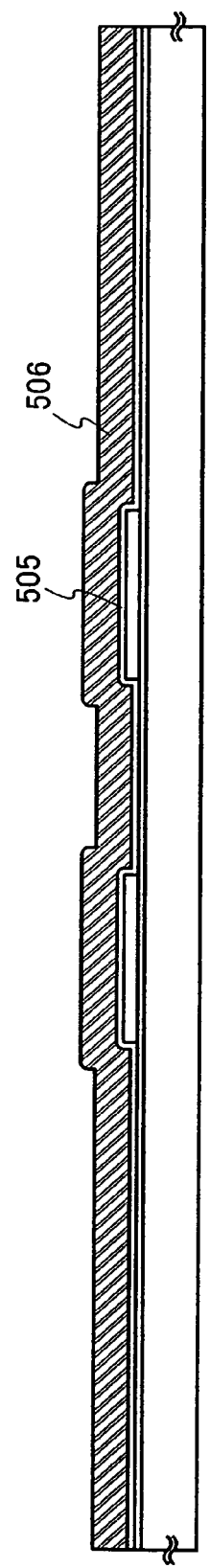

As shown in FIG. 5B, a gate insulating film 505 is formed so as to cover the island shaped semiconductor films 503 and 504. The film thickness of the gate insulating film 505 is reduced by approximately 10 nm to 40 nm during dry etching which is carried out later for forming a gate electrode; therefore it is desirable that the film thickness of the gate insulating film 505 be set by taking the reduction in thickness into account. Specifically, the gate insulating film 505 is formed to have a thickness of approximately 40 nm to 150 nm (preferably from 60 nm to 120 nm).

Silicon oxide, silicon nitride, silicon nitride oxide, or the like can be used for the gate insulating film 505, for example. Although the gate insulating film 505 has a single layer structure in this embodiment mode, it may have a laminated structure of two or more insulating layers. Further, plasma CVD, sputtering, and the like can be used for deposition of the film. For example, when silicon oxide is deposited by plasma CVD to form the gate insulating film 505, the deposition may be performed by using a mixed gas of Tetraethyl Orthosilicate (TEOS) and $O_2$, at a reaction pressure of 40 Pa, a substrate temperature of 300° C. to 400° C., and an RF power density (13.56 MHz) of 0.5 to 0.8 $W/cm^2$.

Further, aluminum nitride can also be used as the gate insulating film 505. The thermal conductivity coefficient of aluminum nitride is relatively high, and heat generated in the TFT can be dissipated efficiently. Alternatively, the gate insulating film 505 may be formed of laminated layers of an insulating film containing no aluminum, for example, silicon oxide or silicon oxynitride and an aluminum nitride film in this order.

Next, a conductive film 506 is formed over the gate insulating film 505. In this embodiment mode, the conductive film 506 is formed using W with a thickness of 100 nm to 500 nm. Specifically, the W used for the conductive film 506 is formed at a deposition speed of approximately 390 nm/min. This is achieved by using a W target having a purity of 99.99%, with an internal chamber temperature set at 230° C., an Ar flow rate set at 100 ml/mn, an internal chamber pressure set at 1.5 Pa, and a deposition power set at 6 kW.

Specifically, for the conductive film 506, an element selected from Ta, W, Ti, Mo, Al, and Cu, or alloys or chemical compounds having one of these elements as its main component may be used.

In this embodiment mode, an example of forming the conductive film 506 with a single layer structure is described; however, the conductive film may be formed using with a multi-layer structure having two or more layers. Further, the materials for each conductive layer are not limited to those described in this embodiment mode.

Figure 5C:
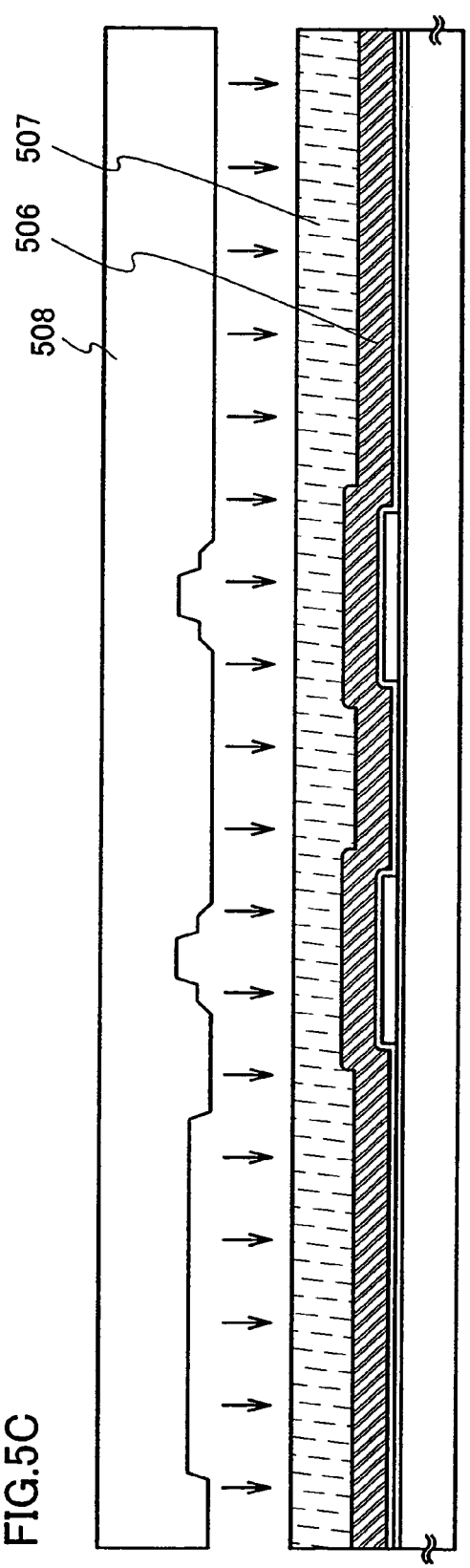

As shown in FIG. 5C, a resist 507 is formed so as to cover the conductive film 506. The resist 507 is formed of a material which is capable of being formed in accordance with the kind of the nanoimprinting methods employed. In this embodiment mode, the case of a thermal cycle nanoimprinting method is described as an example. However, a photo cycle nanoimprinting method or a room temperature nanoimprinting method may be used. In the case of using the thermal cycle nanoimprinting method, a thermoplastic resin such as PMMA is used for the resist 507. The resist 507 is formed by spin coating, slit coating, or the like. Alternatively, the resist 507 can be applied selectively to the necessary portions by ink jetting or screen printing. The resist 507 is heated up to a temperature higher than a temperature of transfer of approximately 90° C. to 200° C., for example, to being softened.

Figure 6A:
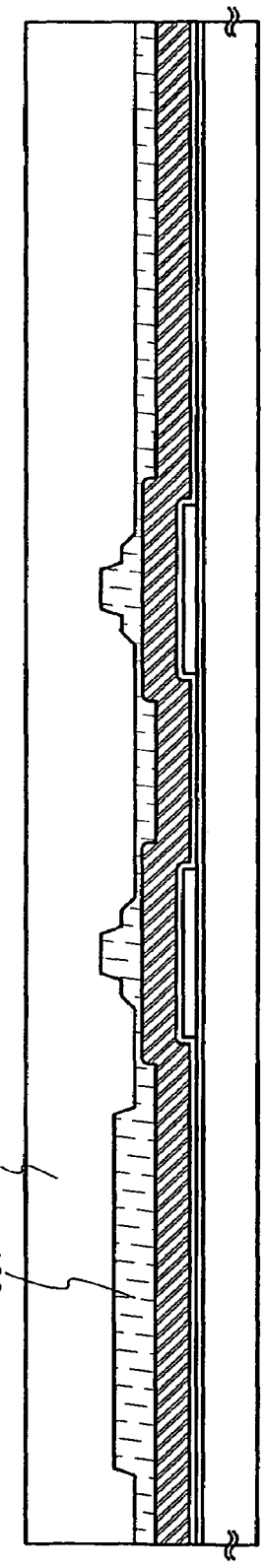
FIGS. 6A to 6D are diagrams showing a method for manufacturing a semiconductor device of the invention.
Figure 6B:
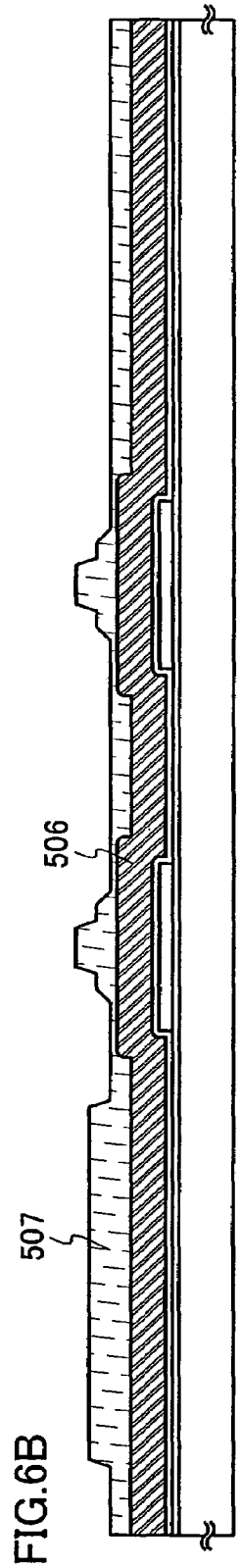

The resist 507 is cooled down to 70° C. to be hardened while keeping the mold 508 pressed thereto with a pressure at 5 to 15 MPa as shown in FIG. 6A. When the mold 508 is detached from the resist 507 as shown in FIG. 6B, a pattern of the mold 508 is transferred to the resist 507.

Figure 6C:
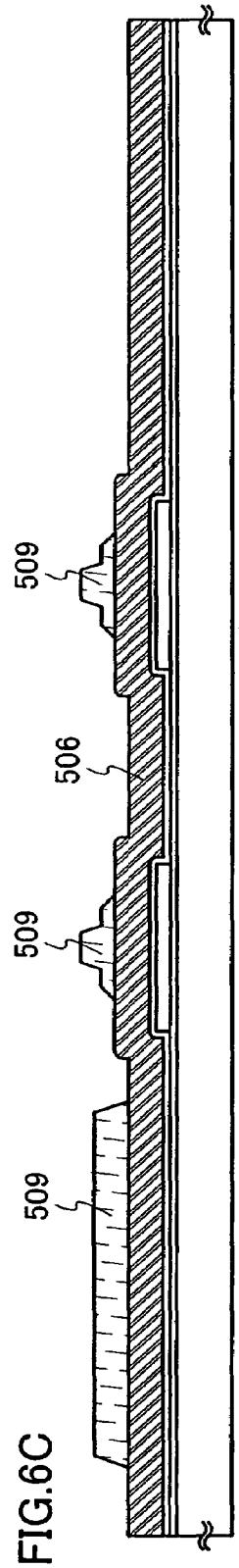

As shown in FIG. 6C, the surface of the resist 507 formed with a pattern is treated by ashing or the like to remove a part of it so that the surface of the conductive film 506 is exposed. According to such ashing, the resist 507 can be formed into a resist mask 509 which can be used as a mask in the subsequent etching.

Figure 6D:
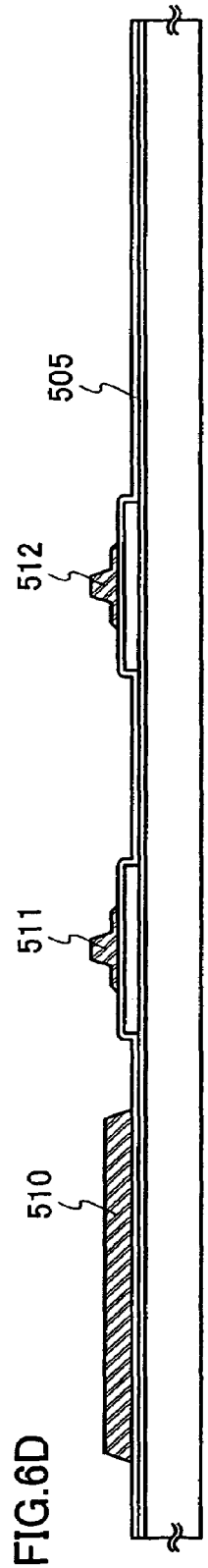

Then, the conductive film 506 is etched as shown in FIG. 6D by using the resist mask 509. In this embodiment mode, etching is performed by using ICP (inductively coupled plasma). $CF_4$, $Cl_2$, and $O_2$ are supplied as an etching gas with a flow rate of 17 sccm, 17 sccm and 10 sccm respectively and the pressure of the etching gas in a chamber is set at 1.5 Pa. Then, high-frequency (RF) power of 500 W and 13.56 MHz is applied to a coiled electrode to generate plasma. High-frequency (RF) power of 160 W and 13.56 MHz is applied to a stage (bottom electrode) over which a substrate is mounted, therefore, self-biasing voltage is applied to the substrate.

A first connection terminal 510 and gate electrodes 511 and 512 are formed by this etching. The gate electrodes 511 and 512 are overlapped with the island shaped semiconductor films 503 and 504 respectively while sandwiching the gate insulating film 505 therebetween. In this embodiment mode, each of the gate electrodes 511 and 512 has steps. The steps include two tiers in thickness. The size and the presence of the steps included in the gate electrodes 511 and 512 can be properly set according to the pattern shape of the mold 508.

For example, the pattern shape of the mold 508 is set so that the thicker portions of the gate electrodes 511 and 512 have a thickness of approximately 450 nm to 470 nm while the thinner portions thereof have a thickness of approximately 50 nm to 70 nm. The conductive film 506 has a difference in thickness thereof between the regions which are overlapped with the island shaped semiconductor films 503 and 504, and the regions which are not overlapped with the island shape semiconductor films 503 and 504. Thus, in the case of removing the remaining film of the resist 507 formed with the pattern by ashing, the remaining film of the regions which are overlapped with the island shaped semiconductor films 503 and 504 is removed faster than the other regions and the resist mask 509 is thus easily and excessively etched. Therefore, the pattern shape of the mold 508 is desirably set in consideration of the film thickness of the island shaped semiconductor films 503 and 504. In this embodiment, the depth of the first concavity portion in the mold 508 corresponding to the gate electrodes 511 and 512 is 150 nm to 250 nm, and the depth of the second concavity portion in the mold 508 corresponding to the gate electrodes 511 and 512 is 550 nm to 2000 nm.

When etching is performed so that the conductive film 506 is completely removed, the part of the surface of the gate insulating film 505 which is not covered with the first connection terminal 510 and the gate electrode 511 and 512 may be etched in depth of approximately 5 nm to 10 nm.

As shown in FIG. 7A, impurities imparting n-type conductivity are doped into the island shaped semiconductor films 503 and 504 by using the gate electrodes 511 and 512 as masks (a first doping step). Doping is performed by ion implantation with a dose amount of $1 \times 10^{13}$ to $5 \times 10^{14}$ atoms/cm$^2$, and an acceleration voltage of 40 to 80 kV. Group 5 elements such as P, As, and Sb, and group 6 elements such as S, Te, and Se, which all function as donors, may be used as the impurity elements imparting n-type conductivity. In this embodiment mode, P is employed.

By the first doping step, first impurity regions 514 and 515 are formed in a self-aligning manner. Impurity elements imparting n-type conductivity are doped into the first impurity regions 514 and 515 at a concentration range of $1 \times 10^{18}$ to $1 \times 10^{20}$ atoms/cm$^3$.

A second doping step is performed next as shown in FIG. 7B, using the thicker portions of the gate electrodes 511 and 512 as masks. The acceleration voltage used in the second doping step is set higher than that used in the first doping step so that the impurities pass through the thinner portions of the gate electrodes 511 and 512. The second doping step forms an LDD region, and therefore the dose amount of the n-type impurities is set smaller than that used in the first doping treatment. Specifically, the acceleration voltage is set in the range of 60 kV to 120 kV, and the dose amount is set in the range of $1 \times 10^{13}$ to $1 \times 10^{15}$ atoms/cm$^2$.

A third doping step is performed next with an acceleration voltage set lower than that used in the second doping in order to obtain the state shown in FIG. 7B. The acceleration voltage is set in the range of 50 kV to 100 kV, and the dose amount is set in the range of $1 \times 10^{15}$ to $1 \times 10^{17}$ atoms/cm$^2$ in the third doping step. Through the second and third doping steps, second impurity regions 516 and 517 which overlap with the thinner portion of the gate electrode 511 and 512 respectively are formed, and then third impurity regions 518 and 519 are formed by doping more impurities into the first impurity regions 514 and 515. The n-type impurities are doped into the second impurity regions 516 and 517 at a concentration range of $1 \times 10^{18}$ to $5 \times 10^{19}$ atoms/cm$^3$, and the n-type impurities are doped into the third impurity regions 518 and 519 at a concentration range of $1 \times 10^{19}$ to $5 \times 10^{21}$ atoms/cm$^3$.

The second impurity regions 516 and 517 are formed so as to sandwich by the third impurity regions 518 and 519 respectively. The second impurity regions 516 and 517 function as IDD regions and the third impurity regions 518 and 519 function as a source or a drain region.

Needless to say, it is also possible to form a low concentration impurity region and a high concentration impurity region by integrating the second doping step and the third doping step into one doping step if the acceleration voltage is set at an adequate level.

It is to be noted that, as the island-shaped semiconductor film 504 which is used for forming a p-channel TFT does not need to be doped with n-type impurities through the second and third doping steps shown in FIGS. 7A and 7B, it may be covered with a mask during the doping steps of n-type impurities. In addition, it is also possible not to provide masks for the purpose of reducing the number of masks, and increase the concentration of the p-type impurities, thereby inverting the polarity of the island-shaped semiconductor film 504 into p-type. Described in this embodiment mode is an example in which the polarity of the island-shaped semiconductor layer 504 is inverted into p-type.

As shown in FIG. 7C, by covering the n-channel island shaped semiconductor film 503 with a mask 520, p-type impurities are doped into the island shaped semiconductor film 504 (a fourth doping step). In the fourth doping step, the thicker portions of the gate electrodes 511 and 512 function as masks, thereby forming fourth impurity regions 521 where p-type impurity elements are doped into the island shaped semiconductor film 504 which is used for a p-channel TFT: In this embodiment mode, ion doping using diborane ($B_2H_6$) is employed. As for the fourth impurity regions, the concentration of the n-type impurity region and concentration of the p-type impurity region are different according to the region which is overlapped with thinner portions of the gate electrodes 511 and 512 or with other region. However, in either region, by doping p-type impurity elements at a concentration range of $2 \times 10^{20}$ to $2 \times 10^{21}$ atoms/cm$^3$, the p-type conductivity becomes dominant, thus the fourth impurity regions can function as a source region and a drain region of a p-channel TFT respectively without causing problems.

By means of the above-described steps, impurity regions are formed in each of the island-shaped semiconductor films.

Next, a first interlayer insulating film 522 is formed so as to cover the inland-shaped semiconductor films 503 and 504, the gate insulating film 505, and the gate electrodes 511 and 512 (FIG. 8A). An insulating film containing silicon such as silicon oxide, silicon nitride, and silicon oxynitride may be used as the first interlayer insulating layer 522, and the film thickness is set to be about 100 nm to 200 nm.

Next, heat treatment is performed so as to activate the impurity elements doped into the island-shaped semiconductor films 503 and 504. This step can be performed by thermal annealing using an annealing furnace, laser annealing, or rapid thermal annealing (RTA). For example, when performing activation by thermal annealing, it is performed at a temperature of 400° C. to 700° C. (preferably at 500° C. to 600° C.) under a nitrogen atmosphere containing oxygen at a concentration of 1 ppm or less, preferably 0.1 ppm or less. In addition, heat treatment is further performed at a temperature of 300° C. to 450° C. for 1 to 12 hours in an atmosphere containing hydrogen by 3 to 100%, thus performing hydrogenation of the island-shaped semiconductor films 503 and 504. This is performed in order to terminate dangling bonds in the semiconductor films by using thermally excited hydrogen. Plasma hydrogenation (using hydrogen excited by plasma) may also be employed as another means of hydrogenation. Further, the activation may also be performed before forming the first interlayer insulating layer 522.

In accordance with the series of steps described above, an n-channel TFT 525 and a p-channel TFT 526 can be formed.

Although the second impurity regions 516 and 517 which function as LDD regions wholly overlap with the thinner portions of the gate electrodes 511 and 512 in this embodiment mode, the invention is not limited to this structure. For example, by forming masks so as to cover a part of the gate electrodes 511 and 512 and the first impurity regions 514 and 515 in the third doping step, LDD regions including regions that overlap with the thinner portions of the gate electrodes 511 and 512 and other regions that do not overlap with them, can be formed.

It is to be noted that the plasma etching described above is not limited to ICP etching. For example, ECR (electron cyclotron resonance) etching, RIE etching, helicon wave etching, helical resonance etching, pulse modulation etching, and other plasma etching may also be used.

Next, a second interlayer insulating film 523 and a third interlayer insulating film 524 are formed so as to cover the first interlayer insulating film 522 as shown in FIG. 8B. In this embodiment mode, an organic resin such as non-photosensitive acryl is used for the second interlayer insulating film 523.

For the third interlayer insulating film 524, a film that allows with difficulty, in comparison with other insulating films, transmitting substances such as moisture and oxygen that may cause the deterioration of the electroluminescent material is used. Typically, a DLC film, a carbon nitride film, a silicon nitride film formed by means of RF sputtering, and the like are preferably used.

Subsequently, by etching the first interlayer insulating film 522, the second interlayer insulating film 523, and the third interlayer insulating film 524, contact holes are formed. Then wirings 530 to 535 are formed. The wiring 530 is connected to the first connection terminal 510 through a contact hole. The wirings 531 and 532 are connected to the island-shaped semiconductor film 503 through the contact holes. The wirings 533 and 534 are connected to the island shaped semiconductor film 504 through contact holes, respectively. A laminated structure of Ti\Al\Ti, Al—C alloy or Al—C—Ni alloy, for example, may be used for the wirings 530 to 535.

Figure 9A:
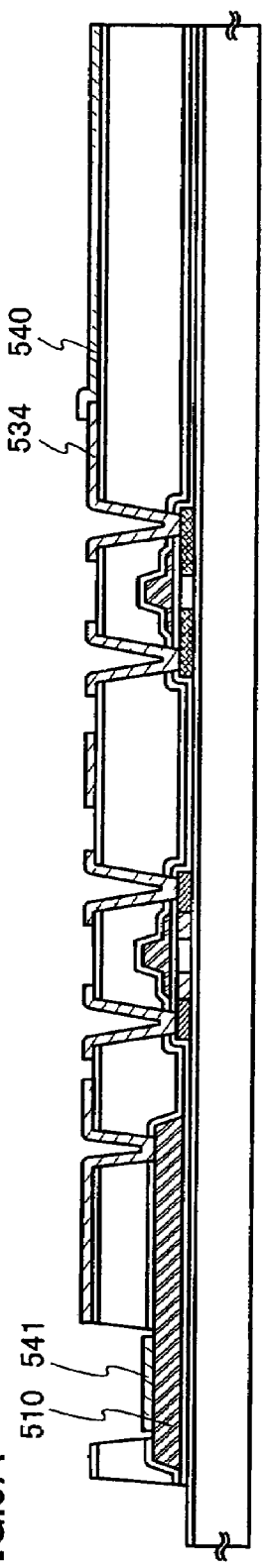
FIGS. 9A to 9C are diagrams showing a method for manufacturing a semiconductor device of the invention.

By forming a transparent conductive film so as to cover the third interlayer insulating film 524 and the wirings 530 to 535 and performing patterning, a first electrode (anode) 540 that is connected to the wiring 534 and a second connection terminal 541 connected to the first connection terminal 510 in a contact hole can be formed (FIG. 9A). As the conductive material, indium tin oxide (ITO), zinc oxide (ZnO), indium zinc oxide (IZO), and gallium-doped zinc oxide (GZO), or other light-transmitting conductive oxide material can be used for the transparent conductive film. In addition, indium tin oxide containing ITO and silicon oxide (hereinafter referred to as ITSO), or indium oxide containing silicon oxide in which 2% to 20% of zinc oxide (ZnO) is further mixed may be used. In addition to the above light-transmitting conductive oxide material, a single layer structure formed of one or more TiN, ZrN, Ti, W, Ni, Pt, Cr, Ag, Al, or the like; a laminated structure formed of a titanium nitride film and a film containing aluminum as its main component; or a three layer structure formed of a titanium nitride film, a film containing aluminum as its main component, and a titanium nitride film may be used. However, in the case of taking out light at the anode which is formed of a material other than the light-transmitting conductive oxide material, the film thickness thereof is set so as to transmit light (preferably, about 5 nm to 30 nm).

The first electrode 540 may be rubbed and polished by CMP by using a polyvinyl alcohol porous body to level off the surface. After rubbing it by CMP, irradiation of UV rays, oxygen plasma processing and the like may be performed to the surface of the first electrode 540.

Figure 9B:
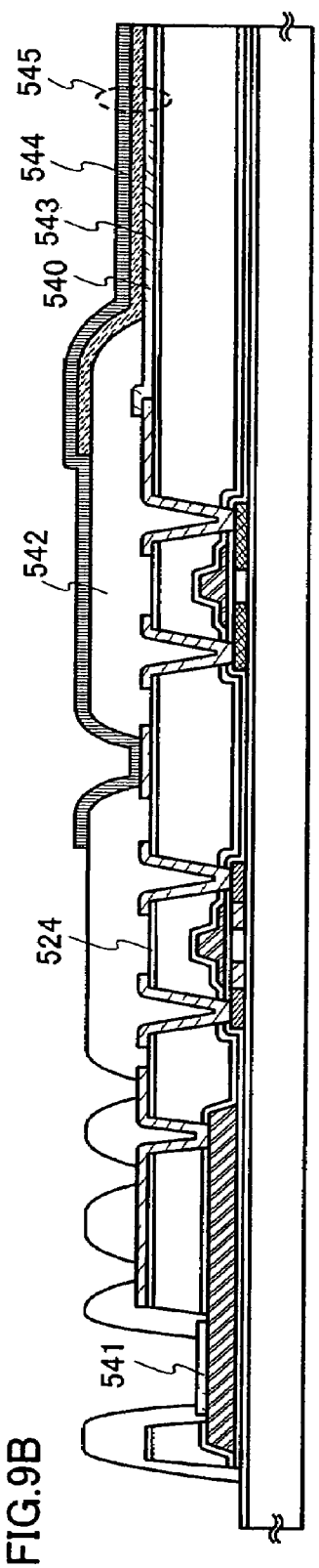

Next, as shown in FIG. 9B, a bank 542 is formed over the third interlayer insulating film 524. An insulating film containing Si—O bonds and Si—CH$_x$ bonds formed of an organic resin film, an inorganic insulating film, and a siloxane-based material as a starting material, or the like can be used for the bank 542. The bank 542 is to cover an end portion of the first electrode 540 and to include an opening portion in the region overlapped with the first electrode 540. The end portion of the opening portion of the bank 542 is desirably formed roundish so that an electroluminescent layer 543 formed later in the end portion does not have a hole. Specifically, it is preferable that a cross section of the bank 542 in the opening portion have a curvature radius of approximately 0.2 μm to 2 μm. The bank 542 also includes an opening portion so that a part of the second connection terminal 541 is exposed.

In this embodiment mode, an example of using a positive photosensitive acrylic resin as the bank 542 is shown. As the photosensitive acrylic resin, there are a positive type in which a portion exposed to an energy line such as light, electron, or ion is removed and a negative type in which a portion exposed to such a energy line is left. In the invention, the negative organic resin film may be used. Further, the bank 542 may be formed by using photosensitive polyimide. In the case of forming the bank 542 by using the negative acrylic, the end portion of the opening portion has a sigmoid cross section. At this time, the curvature radius in the upper end portion and bottom end portion of the opening portion is desirably from 0.2 μm to 2 μm.

According to the above mentioned structure, coverage of the electroluminescent layer 543 and a cathode to be formed later can be improved, and the first electrode 540 and the cathode can be prevented from being short-circuited in a hole formed in the electroluminescent layer 543. Further, by alleviating the stress of the electroluminescent layer 543, a defect called shrink in which a light emitting region is diminished can be suppressed and reliability can be thus improved.

Heat treatment in an atmospheric air or heat treatment in a vacuum atmosphere (vacuum baking) may be performed in order to remove moisture, oxygen, or the like absorbed in the bank 542 and the first electrode 540 before forming the electroluminescent layer 543. Specifically, the heat treatment is performed in a vacuum atmosphere, with a substrate temperature of 200° C. to 450° C., or preferably 250° C. to 300° C. for about 0.5 to 20 hours. The vacuum atmosphere is desirably set at $4 \times 10^{-5}$ Pa ($3 \times 10^{-7}$ Torr) or less, and if possible at $4 \times 10^{-6}$ Pa ($3 \times 10^{-8}$ Torr) or less. In the case where the electroluminescent layer 543 is formed after performing the heat treatment in the vacuum atmosphere, the reliability can be further improved by setting the substrate in the vacuum atmosphere just before the electroluminescent layer 543 is formed. Also, the first electrode 540 may be irradiated with ultraviolet radiation before or after the vacuum baking.

By forming an electrode (in this embodiment, the first electrode 540) in contact with the third interlayer insulating film 524 by using a conductive film containing a light-transmitting conductive oxide material and silicon oxide such as ITSO and by forming the third interlayer insulating film 524 by using silicon nitride, brightness of the light emitting element can be increased than that the case of forming the first electrode 540 and the third interlayer insulating film 524 by using other materials. In this case, moisture is easily absorbed due to the silicon oxide contained in the first electrode 540, thus the above mentioned vacuum baking is extremely effective.

Then, the electroluminescent layer 543 is formed over the first electrode 540. The electroluminescent layer 543 has a single layer structure or a laminated structure, and not only an organic material but also an inorganic material may be contained in each layer. When the work function of the material used for the cathode is not low enough in the electroluminescent layer 543, an electron injection layer is desirably provided.

A second electrode (cathode) 544 is formed so as to cover the electroluminescent layer 543. The first electrode 540, the electroluminescent layer 543, and the second electrode 544 are overlapped with each other in the opening portion of the bank 542, and the overlapped portion corresponds to a light emitting element 545.

Further, a metal with low work function, an alloy, an electrically conductive compound, a mixture of these materials, or the like can be used as the second electrode 544. Specifically, in addition to an alkali metal such as Li and Cs, and an alkaline earth metal such as Mg, Ca, and Sr, an alloy containing these (for example, Mg:Ag, Al:Li, and Mg:In), a compound containing these (CaF$_2$, CaN and the like) and a rare-earth metal such as Yb and Er, or the like can be used. When the electron injection layer is provided, another conductive layer such as an Al layer may be used. In the case of taking out light at the cathode side, other light-transmitting conductive oxide materials such as indium tin oxide (ITO), zinc oxide (ZnO), indium zinc oxide (IZO), and gallium-doped zinc oxide (IZO) can be used. In addition, ITO, indium zinc oxide containing silicon oxide (ITSO), or indium oxide containing silicon oxide in which 2% to 20% of zinc oxide (ZnO) is further mixed may be used. In the case of using the light-transmitting conductive oxide material, an electron injection layer is desirably provided in the electroluminescent layer 543. The light can be taken out at the cathode side, without using the light-transmitting conductive oxide material, by forming the cathode with a film thickness enough to transmit light preferably about 5 nm to 30 nm. In this case, a light-transmitting conductive layer is formed using a light-transmitting conductive oxide material so as to be in contact with the top or the bottom of the cathode, in order to suppress sheet resistance of the cathode and the conductive layer.

After the light emitting element 545 is formed, a protective film may be formed over the second electrode 544. As is the case with the third interlayer insulating film 524, the protective film is formed of a film that allows with difficulty, in comparison with other insulating films, transmitting substance such as moisture and oxygen that may cause the deterioration of the light emitting element. Typically, a DLC film, a carbon nitride film, a silicon nitride film formed by RF sputtering, or the like is preferably used. Further, a laminated film of the above mentioned films that allows with difficulty transmitting substance such as moisture and oxygen and a film which allow transmitting substance easily, as compared with the film, may be used as the protective film.

In this embodiment mode, an example of using the first electrode 540 as an anode and the second electrode 544 as a cathode is described; however, the invention is not limited to this structure. The cathode may be used for the first electrode 540 and the anode may be used for the second electrode 544.

Figure 9C:
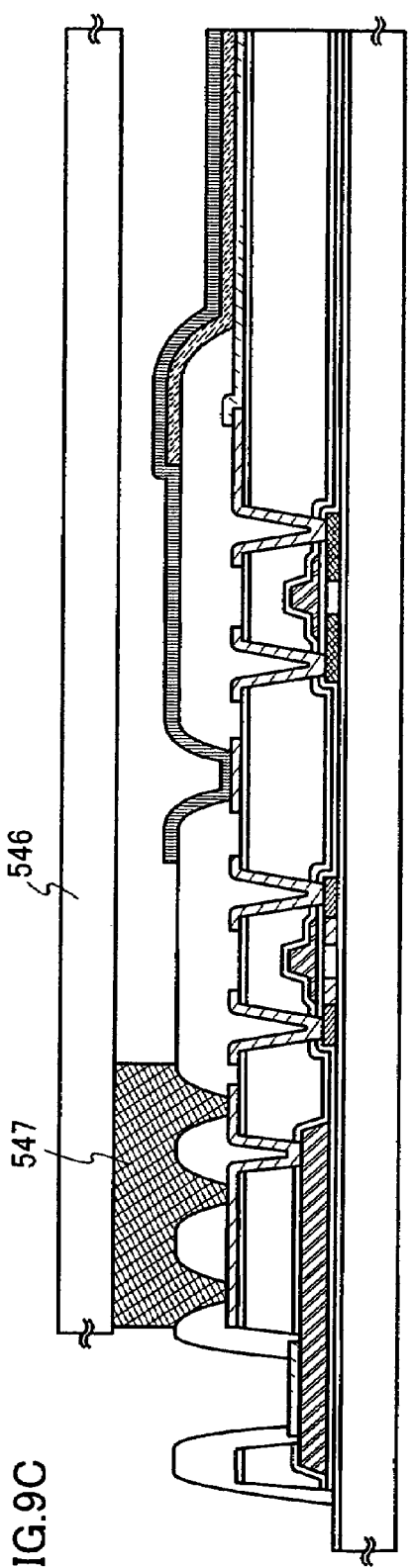

After completing the step up to FIG. 9B, the light emitting element 545 is sealed between the substrate 501 and a cover material 546 by using an adhesive agent 547 so as not to expose the light emitting element 545 to the air as shown in FIG. 9C. At this time, by filling the inside of the cover material 546 with an inert gas, or by arranging a material having hygroscopic properties (for example, barium oxide) inside, the reliability of the light emitting element 545 is improved. Note that the opening portion where a part of the second connection terminal 541, which is formed in the bank 542, is exposed so as not to be sealed between the substrate 501 and the cover material 546.

In this embodiment mode, a resist mask formed by a nanoimprinting method is used for a mask for forming a gate electrode of the TFT by patterning; however, the invention is not limited to this structure. For example, in the case of forming the island shaped semiconductor films 503 and 504, the resist mask formed by the nanoimprinting method may be used. Further, in the case of forming the wirings 530 to 535 and the first electrode (anode) 540, the resist mask formed by the nanoimprinting method may be used. Furthermore, in the case of forming contact holes in the first interlayer insulating film 522, the second interlayer insulating film 523, and the third interlayer insulating film 524, the resist mask formed by the nanoimprinting method may be used. Also, in the case of forming an opening portion in the bank 542, the resist mask formed by the nanoimprinting method may be used. Note that contact holes and an opening portion can be formed by forming a concavity portion by the nanoimprinting method directly, and subsequently etching the concavity portion.

Note that the manufacturing method of the invention is not necessarily limited to the above modes. The embodiment mode described above specifically describes one mode of the invention. Therefore, the invention is not limited to the above mentioned embodiment mode, and changes and modifications according to the technical idea of the invention are possible.

Further, a semiconductor device may be formed by transferring a semiconductor element manufactured according to the above mentioned steps to a flexible substrate such as plastic. Various methods for transferring the semiconductor element such as: by providing a metal oxide film between the substrate and the semiconductor element and separating the semiconductor element with embrittlement due to crystallization of the metal oxide film; by providing an amorphous silicon film containing hydrogen between the substrate and the semiconductor element, performing laser irradiation or etching to remove the amorphous silicon film and separating the substrate and the semiconductor element; and by mechanically separating the semiconductor element from the substrate over which the semiconductor-element is formed or separating the semiconductor element from the substrate by etching with solution or gas. Note that the transfer step may be performed either before or after manufacturing the display element.

This embodiment can be performed in a combination with the above mentioned embodiment modes.

Embodiment 1

In this embodiment, an alignment method of a mold is described.

Figure 10A:
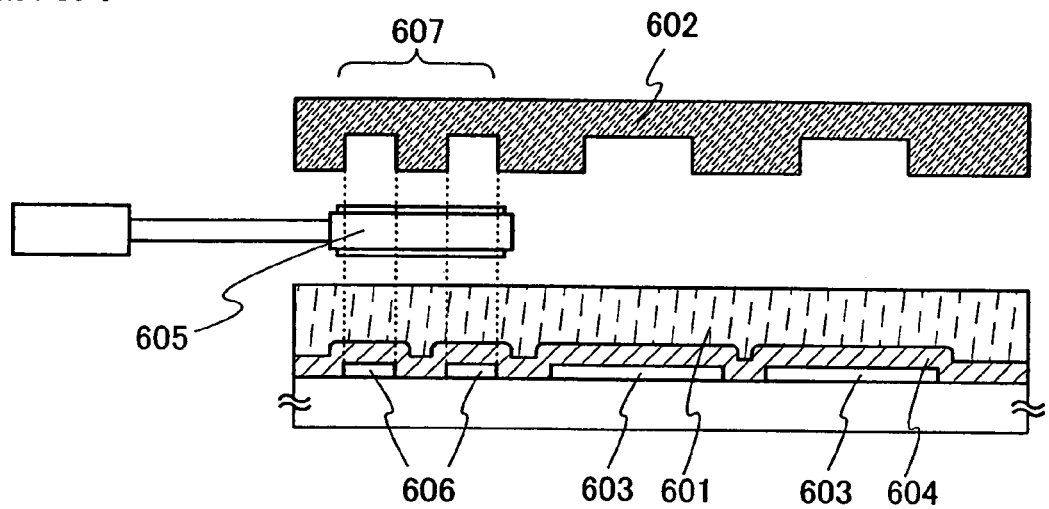
FIGS. 10A and 10B are diagrams showing a mode of aligning a mold.

In FIG. 10A, a mode of aligning a resist 601 and a mold 602 is shown by using an imaging device 605 such as CCD (charge coupled device). Note that the resist 601 is used as a resist mask for patterning a conductive film 604 formed over the inland shaped semiconductor film 603.

In this embodiment mode, by patterning the semiconductor film, markers 606 at the side of the resist 601 to serve as a reference marker for alignment and the island shaped semiconductor film 603 are formed at the same time. Further, a part of patterns formed in the mold 602 is used as a maker 607 at the side of the mold 602 to serve as a reference marker for alignment.

In FIG. 10A, by taking an image of the markers 606 and 607 using the imaging device 605 from the space between the mold 602 and the resist 601, alignment of the mold 602 and the resist 601 are performed. According to the above mentioned structure, alignment of the mold 602 and the resist 601 can be performed in the case the light transmitting of the mold 602 is low.

Figure 10B:
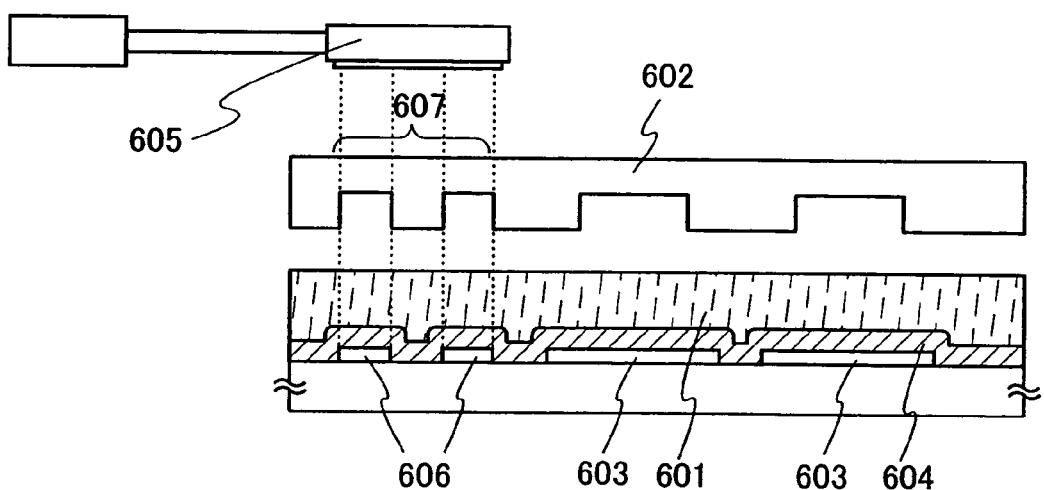

A mode of aligning the resist 601 and the mold 602 is shown in FIG. 10B where the mold 602 transmits light. In FIG. 10B, the same symbols are used for common portions to those shown in FIG. 10A. In FIG. 10B, alignment of the mold 602 and the resist 601 is performed by taking an image of the markers 606 and the 607 from the opposite side of the resist 601 relatively to the mold 602 through the mold 602 by using the imaging device 605 According to the above mentioned structure, the imaging device 605 which can take the image from one direction may be used.

This embodiment can be performed in a combination with the above mentioned embodiment modes.

Embodiment 2

In this embodiment, an example of forming a pattern using a mold in the case of forming a plurality of semiconductor devices over one substrate is described.

Figure 11A:
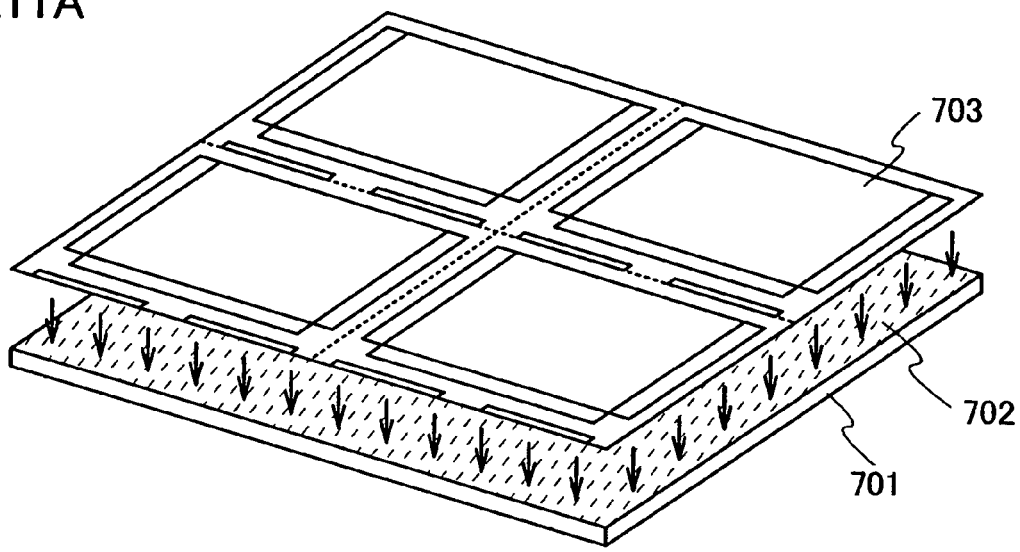
FIGS. 11A to 11C are diagrams showing a mode of forming a pattern in a large size substrate by a nanoimprinting method.

FIG. 11A shows a mode of a substrate 701 over which a resist 702 is formed and a mold 703. A pattern corresponding to each of semiconductor devices is formed in the mold 703. The mold 703 is pressed to the resist 702, thereby forming a pattern in the resist 702.

Figure 11B:
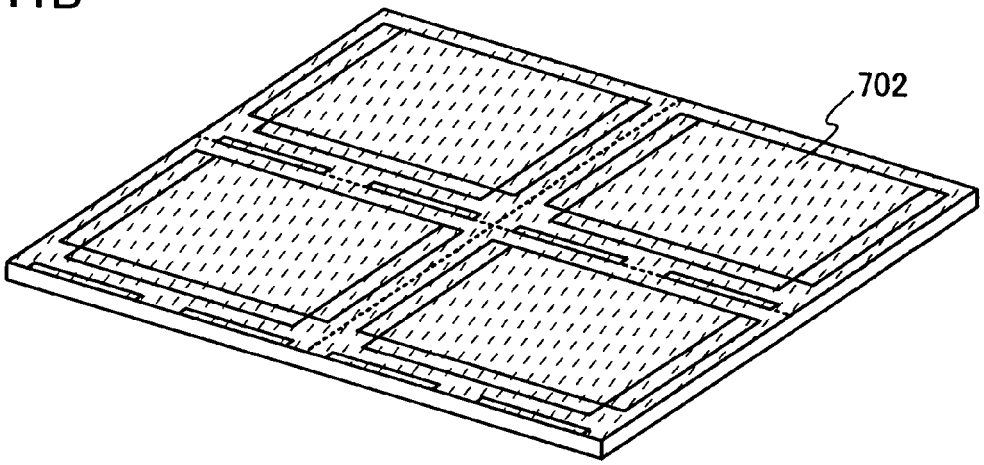
Figure 11C:
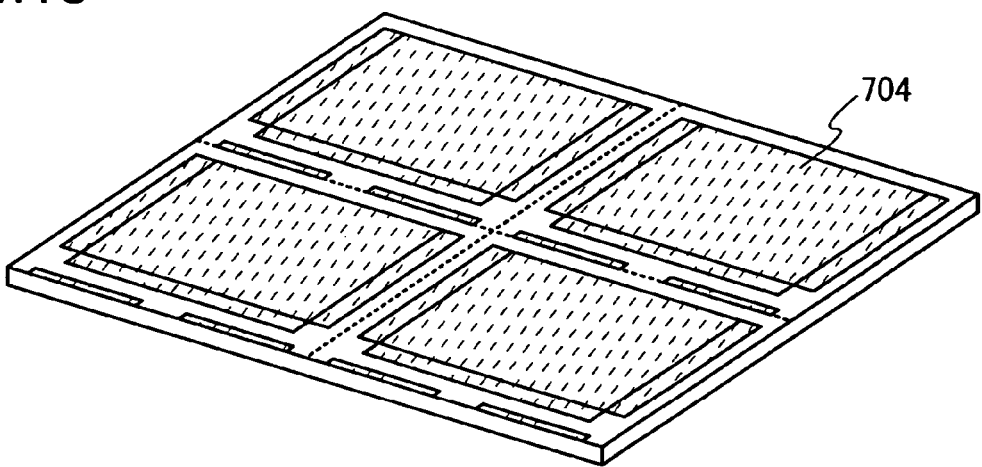

The mold 703 is detached from the resist 702. In FIG. 11B, the mode of the resist 702 formed with the pattern is shown. Then, as shown in FIG. 11C, the surface of the resist 702 formed with the pattern is removed by ashing or the like, thereby forming a resist mask 704.

The example of forming the pattern in the large size substrate by using a mold at one clip is shown in this embodiment. However, the structure of the invention is not limited thereto. The pattern may be formed by pressing the mold in the large size substrate more than once. In this case, a photo nanoimprinting method is used and the region for forming the pattern is sequentially and selectively exposed to light.

In the case of using photolithography, as the size of the substrate becomes larger, the cost of the photomask is increased. Further, since the area to which light-exposure is performed at one time is limited, the problem that total time for patterning is increased occurs. However, in the case of using the nanoimprinting method as in the invention, a photomask is not necessity and time for forming a pattern can be suppressed even when the substrate formed with the pattern becomes larger.

This embodiment can be performed in combination with the above mentioned embodiment modes and embodiments.

Embodiment 3

The semiconductor device of the invention can be applied to a variety of electronic devices such as a video camera, a digital camera, a goggle display (head mounted display), a navigation system, a sound reproducing device (car audio, component stereo set and the like), a notebook personal computer, a game machine, a portable information terminal (mobile computer, portable phone, portable game machine, electronic book and the like), an image reproducing device equipped with a recording medium (typically, a device reproducing a recording medium such as a DVD: Digital Versatile Disk, and having a display for displaying the reproduced image). Specific examples of such electronic devices are shown in FIGS. 12A to 12C.

Figure 12A:
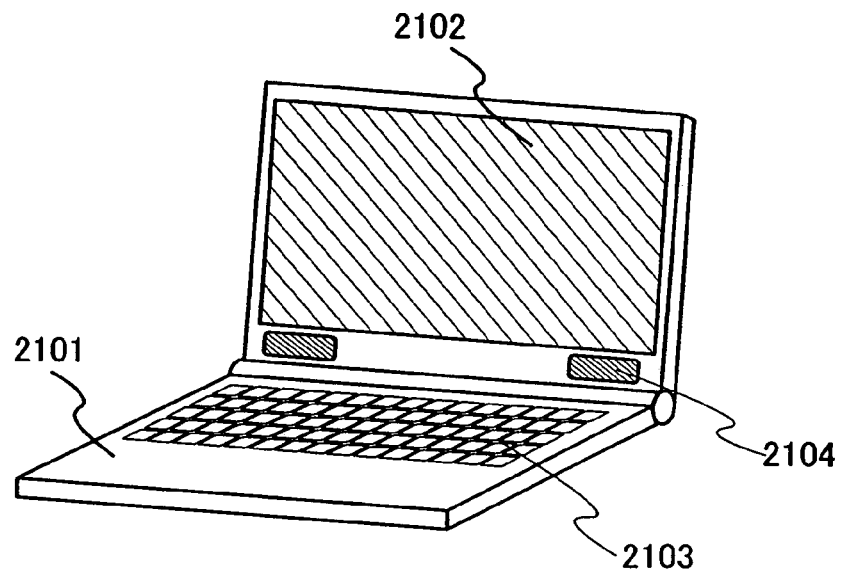
FIGS. 12A to 12C are diagrams showing electronic devices using the invention.

FIG. 12A illustrates a personal computer which includes a main body 2101, a display portion 2102, operation keys 2103, speaker portions 2104, and the like. The semiconductor device of the invention can be applied to the display portion 2102 and a circuit for a signal processing.

Figure 12B:
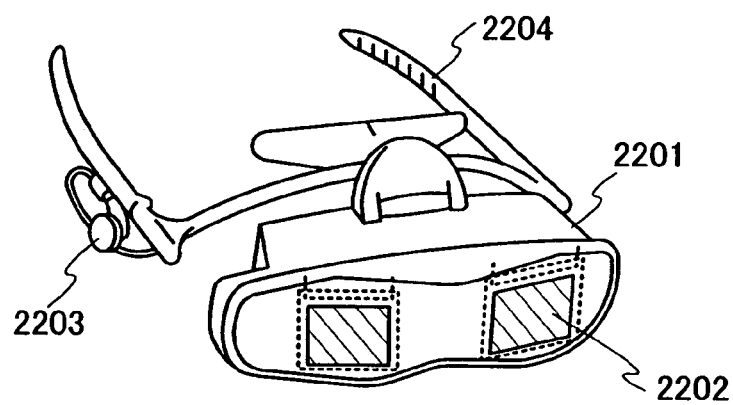

FIG. 12B illustrates a goggle display device which includes a main body 2201, a display portion 2202, an earphone 2203, a supporting portion 2204 and the like. The light emitting device of the invention can be applied to the display portion 2202 and a circuit for a signal processing. The supporting portion 2204 may be of a type for fixing the goggle display device on the user's head or a type for fixing it on other portions of user's body other than the head.

Figure 12C:
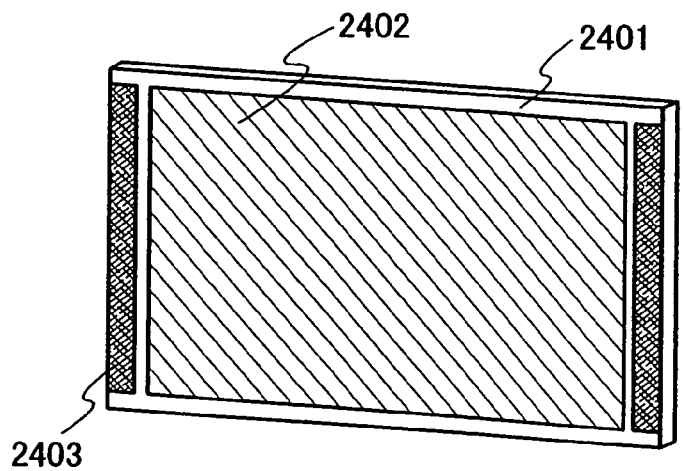

FIG. 12C illustrates a display device which includes a housing 2401, a display portion 2402, a speaker portion 2403 and the like. The light emitting device of the invention can be applied to the display portion 2402 and a circuit for a signal processing. Note that the display device includes all information display devices for personal computer, for TV broadcast reception, for advertisement display and the like.

As set forth above, the application range of the invention is so wide that it can be applied to electronic devices of various fields. In addition, the electronic devices of this example may be used in combination with any of the above mentioned embodiment modes and embodiments.

What is claimed is:

1. A manufacturing method of a semiconductor device comprising:
    forming a gate insulating film over a semiconductor film;
    forming a conductive film over the gate insulating film;
    forming a resist over the conductive film;
    pressing a mold having a pattern to the resist;
    hardening the resist so that the resist has a first portion having a first thickness and a second portion having a second thickness, the second thickness being larger than the first thickness;
    ashing the surface of the resist having the pattern to expose a part of the conductive film;
    etching the conductive film to form a gate electrode by using the resist after ashing as a mask so that the gate electrode has a first portion and a second portion thicker than the first portion of the gate electrode;
    removing the resist after etching the conductive film;
    adding a first impurity to the semiconductor film by using the gate electrode having the first portion and the second portion as a mask; and
    adding a second impurity to the semiconductor film by using the second portion of the gate electrode as a mask to form a channel formation region, a source region or a drain region, and a lightly doped drain region between the channel formation region and the source region or the drain region,
    wherein an acceleration voltage in the step of adding the second impurity is higher than an acceleration voltage in the step of adding the first impurity.

2. The manufacturing method of the semiconductor device according to claim 1, wherein a photo-curing resin is used for the resist and the resist is hardened by irradiating with ultraviolet light.

3. The manufacturing method of the semiconductor device according to claim 1, wherein a thermoplasticity resin is used for the resist and the resist is hardened by heating.

4. The manufacturing method of the semiconductor device according to claim 1, wherein the gate electrode has a step.

5. The manufacturing method of the semiconductor device according to claim 1, wherein the second impurity passes through the first portion of the gate electrode.

6. A manufacturing method of a semiconductor device comprising:
    forming a gate insulating film over a semiconductor film;
    forming a conductive film over the gate insulating film;
    forming a resist over the conductive film;
    pressing a mold having a first concave portion and a second concave portion formed in the first concave portion to the resist;
    hardening the resist to form a pattern having a first convex portion and a second convex portion corresponding to the shape of the first concave portion and the second concave portion of the mold respectively;
    ashing the surface of the resist having the pattern to expose a part of the conductive film;

etching the conductive film by using the resist after ashing as a mask to form a gate electrode so that the gate electrode has a first portion and a second portion;

removing the resist after etching the conductive film;

adding a first impurity to the semiconductor film by using the gate electrode having the first portion and the second portion as a mask; and adding a second impurity to the semiconductor film by using the second portion of the gate electrode as a mask to form a channel formation region, a source region or a drain region, and a lightly doped drain region between the channel formation region and the source region or the drain region, wherein an acceleration voltage in the step of adding the second impurity is higher than an acceleration voltage in the step of adding the first impurity, and wherein the first portion of the gate electrode corresponds to the first convex portion of the, resist and the second portion of the gate electrode corresponds to the second convex portion of the resist.

7. The manufacturing method of the semiconductor device according to claim 6, wherein a photo-curing resin is used for the resist and the resist is hardened by irradiating with ultraviolet light.

8. The manufacturing method of the semiconductor device according to claim 6, wherein a thermoplasticity resin is used for the resist and the resist is hardened by heating.

9. The manufacturing method of the semiconductor device according to claim 6, wherein the second impurity passes through the first portion of the gate electrode.

10. A manufacturing method of a semiconductor device comprising:

forming a gate insulating film over a semiconductor film;

forming a conductive film over the gate insulating film;

forming a resist over the conductive film;

pressing a mold having a first concave portion and a second concave portion formed in the first concave portion to the resist;

hardening the resist to form a pattern having a first convex portion and a second convex portion corresponding to the shape of the first concave portion and the second concave portion of the mold respectively;

etching the conductive film by using the resist as a mask to form a gate electrode so that the gate electrode has a first portion and a second portion;

removing the resist after etching the conductive film;

adding a first impurity to the semiconductor film by using the gate electrode having the first portion and the second portion as a mask; and adding a second impurity to the semiconductor film by using the second portion of the gate electrode as a mask to form a channel formation region, a source region or a drain region, and a lightly doped drain region between the channel formation region and the source region or the drain region, wherein an acceleration voltage in the step of adding the second impurity is higher than an acceleration voltage in the step of adding the first impurity, and wherein the first portion of the gate electrode corresponds to the first convex portion of the resist and the second portion of the gate electrode corresponds to the second convex portion of the resist.

11. The manufacturing method of the semiconductor device according to claim 10, wherein a photo-curing resin is used for the resist and the resist is hardened by irradiating with ultraviolet light.

12. The manufacturing method of the semiconductor device according to claim 10, wherein a thermoplasticity resin is used for the resist and the resist is hardened by heating.

13. The manufacturing method of the semiconductor device according to claim 10, wherein the second impurity passes through the first portion of the gate electrode.

14. A manufacturing method of a semiconductor device comprising:

forming a gate insulating film over a semiconductor film;

forming a conductive film over the gate insulating film;

forming a resist over the conductive film;

pressing a mold having a pattern to the resist;

hardening the resist so that the resist has a first portion having a first thickness and a second portion having a second thickness, the second thickness being larger than the first thickness;

etching the conductive film by using the resist having the first and second portions as a mask to form a gate electrode so that the gate electrode has a first portion and a second portion thicker than the first portion of the gate electrode;

removing the resist after etching the conductive film;

adding a first impurity to the semiconductor film by using the gate electrode having the first portion and the second portion as a mask; and adding a second impurity to the semiconductor film by using the second portion of the gate electrode as a mask to form a channel formation region, a source region or a drain region, and a lightly doped drain region between the channel formation region and the source region or the drain region, wherein the first portion of the gate electrode corresponds to the first portion of the resist and the second portion of the gate electrode corresponds to the second portion of the resist, and wherein an acceleration voltage in the step of adding the second impurity is higher than an acceleration voltage in the step of adding the first impurity.

15. The manufacturing method of the semiconductor device according to claim 14, wherein a photo-curing resin is used for the resist and the resist is hardened by irradiating with ultraviolet light.

16. The manufacturing method of the semiconductor device according to claim 14, wherein a thermoplasticity resin is used for the resist and the resist is hardened by heating.

17. The manufacturing method of the semiconductor device according to claim 14, wherein the second impurity passes through the first portion of the gate electrode.

* * * * *